United States Patent
Hashida

(10) Patent No.: US 8,860,477 B2
(45) Date of Patent: Oct. 14, 2014

(54) RECEIVER CIRCUIT

(71) Applicant: Fujitsu Limited, Kawasaki (JP)

(72) Inventor: Takushi Hashida, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 14/077,916

(22) Filed: Nov. 12, 2013

(65) Prior Publication Data

US 2014/0159786 A1 Jun. 12, 2014

(30) Foreign Application Priority Data

Dec. 12, 2012 (JP) ................................. 2012-271102

(51) Int. Cl.
*H03L 7/06* (2006.01)
*H03L 7/00* (2006.01)

(52) U.S. Cl.
CPC ........................................ *H03L 7/00* (2013.01)
USPC .......................................... 327/155; 375/229

(58) Field of Classification Search
None
See application file for complete search history.

(56) References Cited

U.S. PATENT DOCUMENTS

| 8,494,103 | B2 * | 7/2013 | Shibasaki | ...................... 375/355 |
| 2007/0047680 | A1 | 3/2007 | Okamura | |
| 2007/0247191 | A1 | 10/2007 | Tanabe | |
| 2010/0329327 | A1 | 12/2010 | Kato et al. | |
| 2012/0140811 | A1 | 6/2012 | Shibasaki | |

FOREIGN PATENT DOCUMENTS

| JP | 2007-060655 A | 3/2007 |
| JP | 2007-274139 A | 10/2007 |
| JP | 2011-014973 A | 1/2011 |
| JP | 2012-124593 A | 6/2012 |

* cited by examiner

*Primary Examiner* — Cassandra Cox
(74) *Attorney, Agent, or Firm* — Arent Fox LLP

(57) ABSTRACT

A receiver circuit includes a data interpolator to interpolate an input data signal and generate an interpolation data signal, a data determination unit to determine a data determination result of the interpolation data signal, a clock recovery unit to detect phase information based on a data determination result and output an interpolation code determining an interpolation rate to the data interpolator based on the detected phase information, a first interpolator to interpolate the input data signal and generate an interpolation data signal for an eye pattern monitor, a first determination unit for the eye pattern monitor to compare the interpolation data signal with a reference voltage, a match determination unit to determine whether the data determination result of the data determination unit matches a comparison result of the first determination unit, and an eye pattern regenerator to generate an eye pattern based on the phase information and a determination result.

10 Claims, 23 Drawing Sheets

FIG. 5

| Dn-1 | En | Dn | Late | Early |
|------|----|----|------|-------|
| 0 | 0 | 0 | 0 | 0 |
| 0 | 0 | 1 | 0 | 1 |
| 0 | 1 | 0 | 1 | 1 |
| 0 | 1 | 1 | 1 | 0 |
| 1 | 0 | 0 | 1 | 0 |
| 1 | 0 | 1 | 1 | 1 |
| 1 | 1 | 0 | 0 | 1 |
| 1 | 1 | 1 | 0 | 0 |

| TIME T | VOLTAGE V | NUMBER OF ERRORS RE | NUMBER OF SAMPLES RS |
|---|---|---|---|
| 0 | 0 | | |
| 0 | 1 | | |
| ... | | | |
| 31 | 13 | | |
| 31 | 14 | | |
| 31 | 15 | | |

FIG. 14B

| NUMBER OF ERRORS RE(T, V) | NUMBER OF SAMPLES RS(T, V) |
|---|---|
| | |

FIG. 14C

| TIME T | NUMBER OF ERRORS RE(V) | NUMBER OF SAMPLES RS(V) |
|---|---|---|
| 0 | | |
| 1 | | |
| ... | | |
| 30 | | |
| 31 | | |

RECEIVER CIRCUIT

CROSS-REFERENCE TO RELATED APPLICATION

This application is based upon and claims the benefit of priority of the prior Japanese Patent Application No. 2012-271102, filed on Dec. 12, 2012, the entire contents of which are incorporated herein by reference.

FIELD

The embodiments discussed herein are related to a receiver circuit, and for example, to a receiver circuit including a data interpolator (DI) that generates interpolation data with an interpolation coefficient, based on a plurality of pieces of data among data input in time sequence.

BACKGROUND

With improvements in performance of information processing apparatuses, such as a communication backbone apparatus or a server, it may be desirable to increase a data rate for transmitting and receiving signals inside and outside the apparatus. Examples of a receiver circuit of a transmission and reception apparatus include a tracking-type receiver circuit in which a phase of a sample clock follows input data and a blind-type receiver circuit in which a phase of a clock does not follow input data.

FIGS. 1A and 1B illustrate a configuration and an operation of a synchronization-type clock data recovery unit of a tracking-type receiver circuit. As illustrated in FIG. 1A, the synchronization-type clock data recovery unit includes a comparator 11, a clock recovery unit (CRU) 12, and a phase interpolator (PI) 13. The comparator 11 determines that an input data signal Vin indicates "0" or "1", and generates output data Dout. The CRU 12 detects a phase difference between a changing edge of the output data Dout and a changing edge of a clock CLK, and generates a phase interpolation code. For example, one of the changing edges may be a falling edge. The PI 13 shifts the phase of the clock CLK based on a phase interpolation code and generates a clock suitable for sampling the input data signal Vin.

FIG. 1B illustrates operation of a synchronization-type clock data recovery unit in a case in which sampling is performed twice for one period (unit) in the synchronization-type clock data recovery unit. In FIG. 1B, an example is shown in which the sampling is performed at rising edges of the clock CLK and an inverted clock /CLK. The length of one period of the input data signal Vin is similar to but is not the same as the length of one cycle of the clock CLK. When tracking is performed so that the rising edge of the inverted clock /CLK is synchronized with the changing edge of the input data signal Vin, the rising edge of the clock CLK is positioned near the center of one period of the input data signal Vin. In the comparator 11, as shown in FIG. 1A, stable sampling may be performed when the input data signal Vin is sampled at the rising edge of the clock CLK.

A high-speed interface technique involves appropriate control of a parameter of an equalizer or the like in order to adapt to variable components during operation, such as a temperature or a voltage. Accordingly, when a communication failure occurs, it is very difficult to determine the cause of the communication failure through simulations or input and output of digital data. Thus, to include an eye pattern monitor for monitoring an internal waveform of a receiver circuit or an opening degree of an eye pattern may be advantageous in analyzing a communication failure.

FIG. 2 is a diagram that illustrates an eye pattern monitor in a tracking-type receiver circuit. As illustrated in FIG. 2, in the eye pattern monitor, which determines whether it is possible to receive data correctly at each lattice point and indicates a bit error rate, an eye pattern of an input data signal is divided like a lattice in resolution in a time direction and a voltage direction. In FIG. 2, a portion of the figure denoted by E indicates a range in which the input data signal is stable.

Accordingly, in order to obtain an eye pattern, it may be desired to perform a sweep in each of the time direction and the voltage direction. In this case, it may be desired to also continue phase tracking while obtaining the eye pattern because, if the tracking is stopped, the lattice point in the eye pattern being currently measured may be lost. In FIG. 2, P denotes a phase of a changing edge of data, P0 denotes a desirable sampling timing, P1 denotes a phase that undergoes the sweep in order to obtain the eye pattern, L denotes a determination level of the output data Dout, and L1 denotes a level at which the sweep is performed in order to obtain the eye pattern.

When the tracking-type receiver circuit includes PIs, a PI to be used for the determination of a received signal and a PI for an edge to be used for the phase tracking are different circuits and thus, each of the PIs may employ an independent interpolation value. As a result, the timing at which the determination as to whether the data is "0" or "1" is actually performed may be shifted while continuing the phase tracking. Various schemes are proposed for the eye pattern monitor of the tracking-type receiver circuit in which PIs are used to cause a phase of a sample clock to follow input data.

In contrast, in the blind-type receiver circuit, since sampling is performed without causing synchronization with a phase of input data, a data interpolation process for generating data of a data center phase is performed by interpolating sampled data based on detected phase information. Since, in a data interpolation-type reception scheme, a sample phase of data is unable to be moved from a position to which an edge is shifted by 90 degrees, it can be difficult to obtain an eye pattern monitor.

Japanese Laid-open Patent Publication No. 2012-124593, Japanese Laid-open Patent Publication No. 2007-274139, Japanese Laid-open Patent Publication No. 2007-060655, and Japanese Laid-open Patent Publication No. 2011-014973 are examples of related art.

SUMMARY

According to an aspect of the invention, a receiver circuit may include a data interpolator configured to interpolate an input data signal and generate an interpolation data signal. The receiver circuit may include a data determination unit configured to determine a data determination result of the interpolation data signal. The receiver circuit may include a clock recovery unit configured to detect phase information based on the data determination result of the data determination unit and output an interpolation code to the data interpolator based on the detected phase information. In an aspect, the interpolation code may determine an interpolation rate of the data interpolator. The receiver circuit may include a first interpolator for an eye pattern monitor configured to interpolate the input data signal and generate an interpolation data signal for the eye pattern monitor. The receiver circuit may include a first determination unit for the eye pattern monitor configured to compare the interpolation data signal for the eye pattern monitor with a reference voltage. The receiver circuit may include a match determination unit configured to determine whether the data determination result of the data determination unit matches a comparison result of the first determination unit for the eye pattern monitor. The receiver circuit may include an eye pattern regenerator configured to generate an eye pattern based on the phase information and a determination result of the match determination unit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 4A illustrates the circuit configuration, FIG. 4B illustrates a signal in a case in which data is ahead of a clock, and FIG. 4C illustrates a signal in a case in which the data is later than the clock;

FIG. 5 is a table indicating truth values of outputs with respect to inputs of the CRU in FIGS. 4A to 4C;

FIG. 8A illustrates signal waveforms while FIG. 8B illustrates coupling states of switches in various operation states;

FIG. 9A illustrates signal waveforms while FIG. 9B illustrates coupling states of switches in various operation states;

FIG. 10A illustrates signal waveforms while FIG. 10B illustrates coupling states of switches in various operation states;

FIG. 11A illustrates signal waveforms, while FIG. 11B illustrates coupling states of switches in various operation states;

FIGS. 14A to 14C illustrate examples of a register in which collected information on an eye pattern is stored;

FIG. 17A illustrates a case in which an interpolation rate k of a DI is 0.8 while FIG. 17B illustrates a case in which the interpolation rate k of the DI is 0.9;

FIG. 19A illustrates a case in which the data interpolation rate for the eye pattern monitor is 0.9 while FIG. 19B illustrates a case in which the data interpolation rate for the eye pattern monitor is 0.5;

DESCRIPTION OF EMBODIMENTS

According to the embodiments of this application, a receiver circuit that performs a data interpolation process and includes an eye pattern monitor may be obtained.

First, embodiments related to a data interpolation process in a non-synchronization-type clock data recovery unit of a blind-type receiver circuit are described.

Figure 3A:
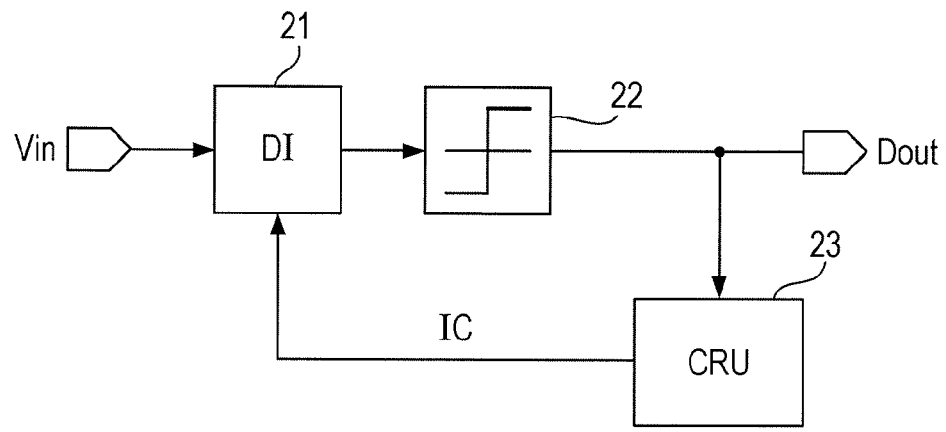
FIGS. 3A and 3B are diagrams illustrating a configuration and an operation of a non-synchronization-type clock data recovery unit of a receiver circuit, which performs a data interpolation process.
Figure 3B:
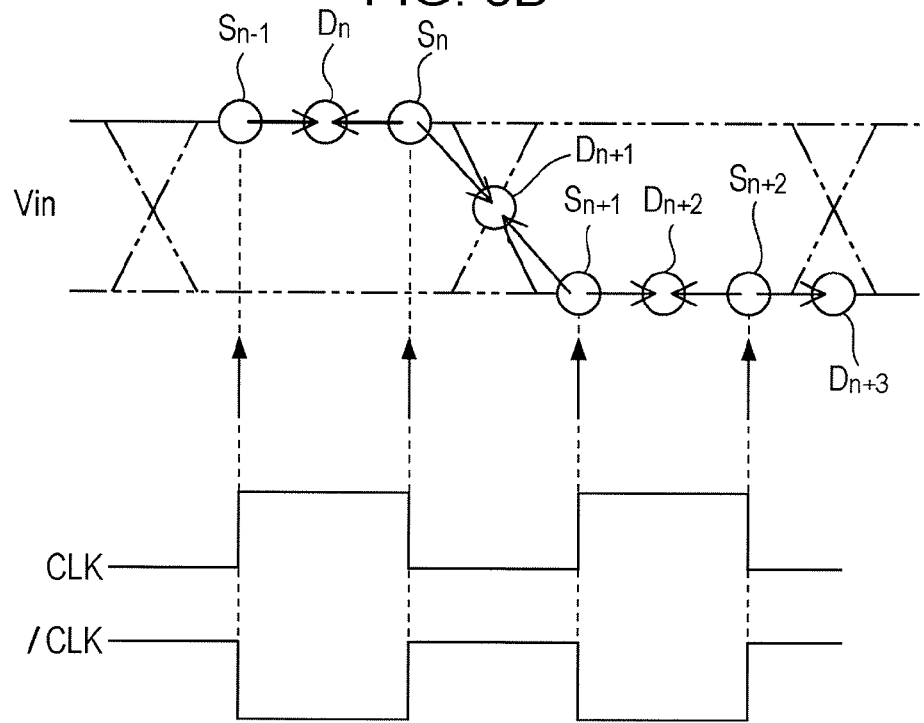

FIGS. 3A and 3B illustrate a configuration and an operation of a non-synchronization-type clock data recovery unit of a receiver circuit, which may be configured to perform a data interpolation process. As illustrated in FIG. 3A, a clock data recovery unit of the blind-type receiver circuit includes a data interpolator (DI) 21, a determination unit 22, and a clock recovery unit (CRU) 23. The DI 21 generates interpolation data of an input data signal Vin based on an interpolation code (IC) output from the CRU 23. The determination unit 22 determines whether the interpolation data indicates "0" or "1" and, based thereon, generates output data Dout. The CRU 23 detects a phase difference between a changing edge of the output data Dout and a changing edge of a clock CLK, which is, for example, a falling edge, and, based thereon, generates the IC.

FIG. 3B shows an operation of the non-synchronization-type clock data recovery unit in a case in which sampling is performed twice for one period (e.g., one unit) of the input data signal Vin. The length of one period of the input data signal Vin is similar to, but is not the same as, the length of one cycle of the clock CLK. In the non-synchronization-type clock data recovery unit, the sampling is performed at a rising edge and a falling edge of the clock CLK, which differs from the operation of a synchronization-type clock data recovery unit where phase interpolation that causes an edge of the clock CLK to be concurrent with a changing edge of the input data signal Vin is not performed. In other words, the clock CLK and the input data signal Vin of a sample are not synchronized with each other and a phase for sampling the input data signal Vin is not uniform. Since the length of one period of the input data signal Vin is not the same as the length of one cycle of the clock CLK as described above, the phase for sampling the input data signal Vin gradually varies. Thus, in the non-synchronization-type clock data recovery unit, the DI 21 performs the interpolation process on values obtained by performing sampling without synchronization in order to generate data near a center of one period of the input data signal Vin.

Typically, interpolation data are generated by calculating two sample values based on an interpolation rate. Since the phase for sampling the input data signal Vin gradually varies as described above, the IC for setting the interpolation rate is changed based on the phase difference detected by the CRU 23.

Figure 1A:
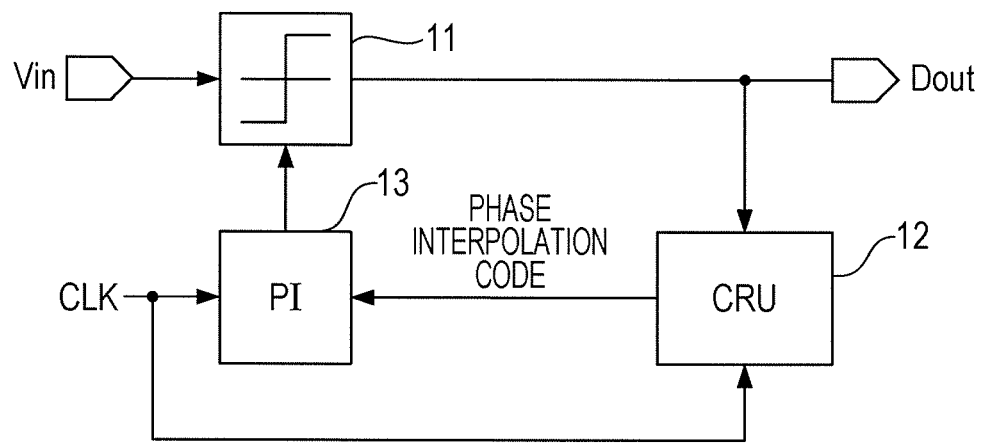
FIGS. 1A and 1B are diagrams illustrating a configuration and an operation of a synchronization-type clock data recovery unit of a tracking-type receiver circuit.
Figure 1B:
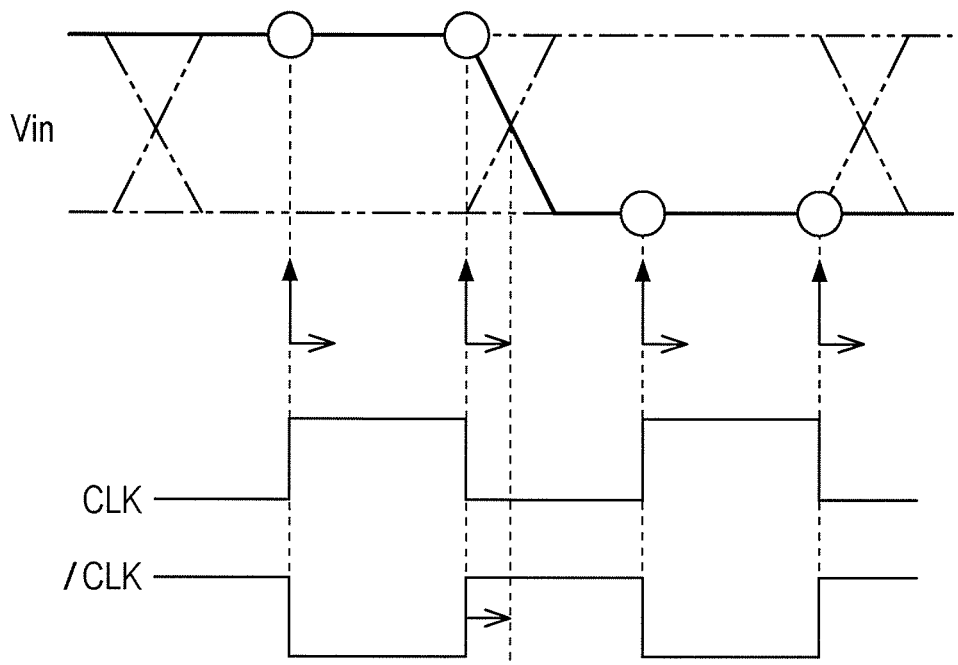
Figure 2:
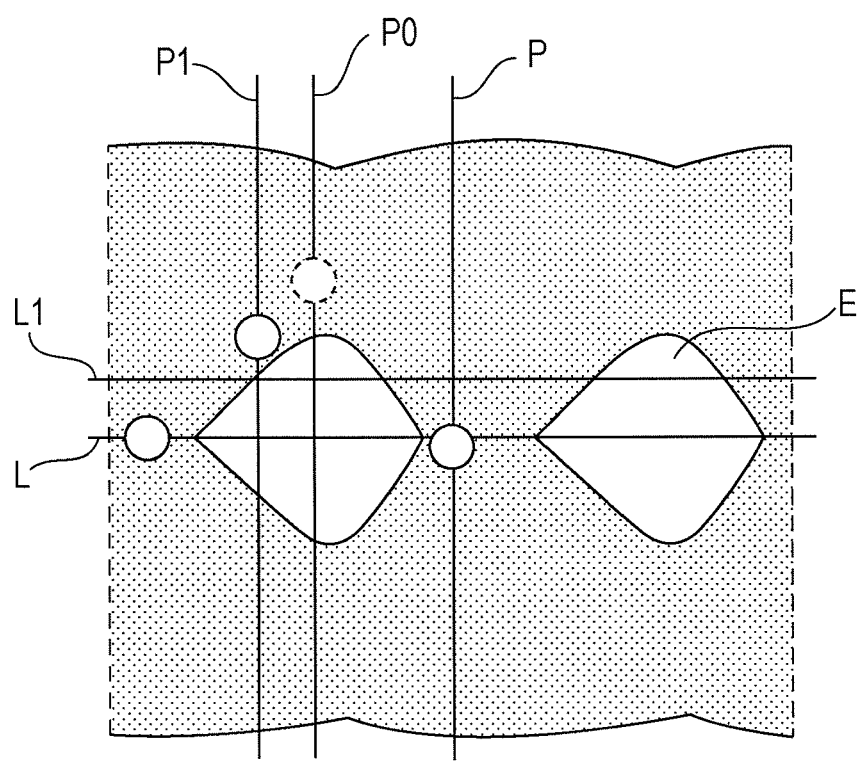
FIG. 2 is a diagram illustrating an eye pattern monitor in the tracking-type receiver circuit.

The determination unit 22 may be similar to the comparator 11 of FIG. 1A used in the synchronization-type clock data recovery unit of the tracking-type receiver circuit, and, as such, no additional explanation of the determination unit 22 will be provided.

Figure 4A:
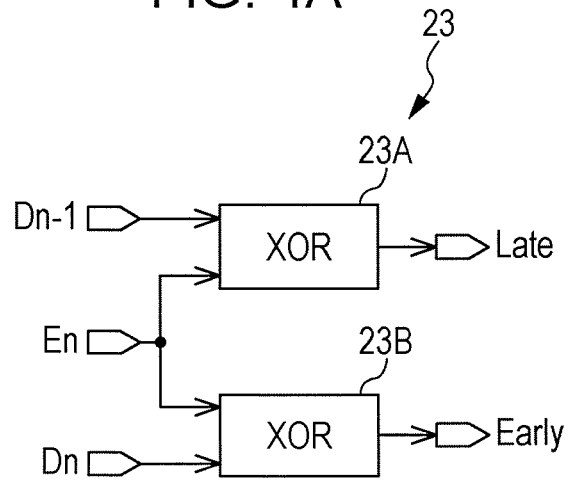
FIGS. 4A to 4C are diagrams illustrating a circuit configuration and an operation of an example of a clock recovery unit (CRU), where
Figure 4B:
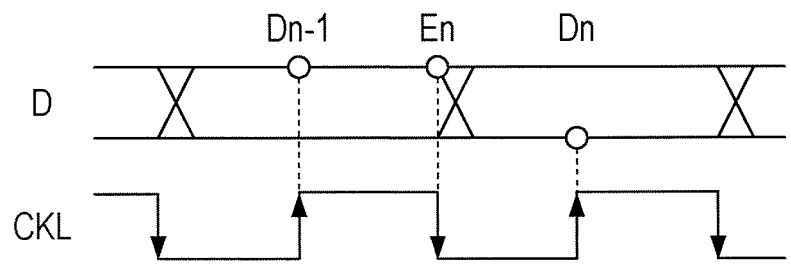
Figure 4C:
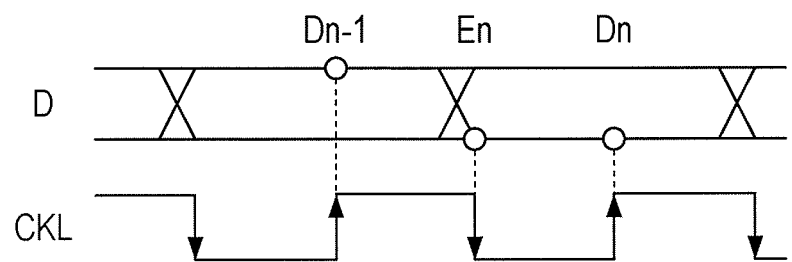

FIGS. 4A to 4C are diagrams illustrating an example circuit configuration and an example operation of the CRU 23. More particularly, FIG. 4A illustrates an example circuit configuration for CRU 23, FIG. 4B illustrates a signal in a case in which data is ahead of a clock, and FIG. 4C illustrates a signal in a case in which the data is later than the clock. FIG. 5 is a table indicating truth values of outputs with respect to inputs of the example of CRU 23 as described with respect to FIGS. 4A to 4C.

As illustrated in FIG. 4A, the CRU 23 is an Alexander phase detector and includes two exclusive OR (XOR) circuits 23A and 23B. Immediately preceding data Dn-1 that have been sampled at a rising edge of the clock CLK and data En that have been sampled at a falling edge of the clock CLK are input to the XOR circuit 23A, and data Dn and data En are input to the XOR circuit 21B. An output Late is output from the XOR circuit 23A, and an output Early is output from the XOR circuit 23B.

As illustrated in FIG. 5, when both the data Dn-1 and the data Dn indicate "1" or both indicate "0", it is impossible to detect whether the data D is ahead of or later than the clock CLK. When the data Dn-1 and the data Dn are different from each other and the output Early indicates "1", the clock CLK is ahead of the data D, and when the output Late indicates "1", the clock CLK is later than the data D. The Alexander phase detector may be advantageous in a scheme in which the sampling is performed twice for one period of the input data Vin, and phase detection is performed when a data point makes a transition. The Alexander phase detector is only one example of the CRU 23. CRU 23 may be any other device configured to detect a phase difference between the clock CLK and the data. Information on the detected phase difference is aggregated in a digital filter at a subsequent stage and used as an interpolation code so that the phase difference may be detected in a higher resolution.

First Embodiment

Figure 6A:
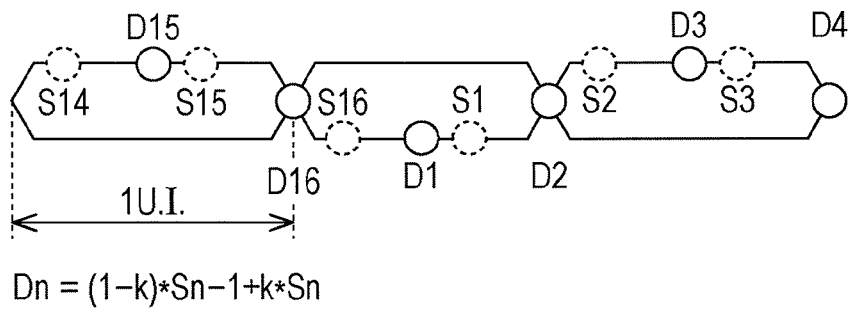
FIGS. 6A to 6C are diagrams illustrating a process of a data interpolator (DI), a basic circuit configuration of the DI, and actuating signals of the basic circuit configuration of the DI.
Figure 6B:
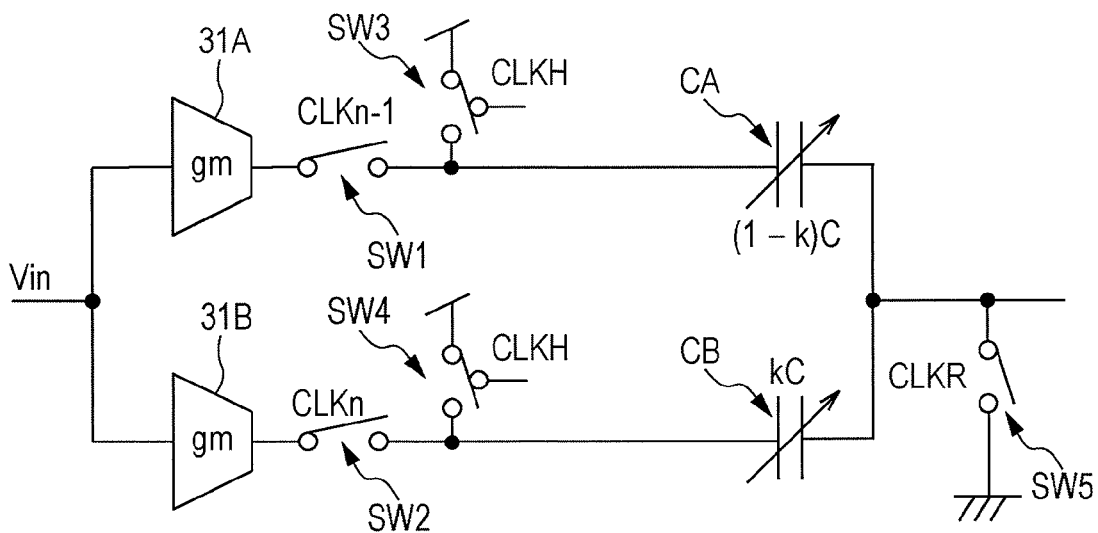
Figure 6C:
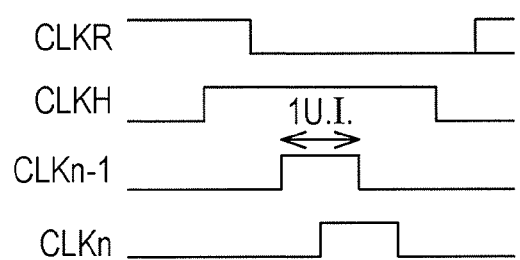

FIGS. 6A to 6C are diagrams illustrating an example of a process and an example of a basic circuit configuration of the DI 21, along with actuating signals of the example basic circuit configuration of the DI. As illustrated in FIG. 6A, sampling is performed twice in one period (e.g., one unit), referred to as 1 U.I., of the input data signal Vin, and two pieces of sample data Sn are generated in each U.I. Based on phases of the two pieces of sample data Sn, the data Dn of a center phase, which is a 180-degree phase, and data D+1 of an edge phase, which is a 0- or 360-degree phase, are both generated. In FIG. 6A, data D15 of a 180-degree phase are generated by the interpolation process and based on sample data S14 and S15. Data D16 of a 360-degree phase are generated by the interpolation process and based on the sample data S15 and sample data S16. Data D1 of a 180-degree phase are generated by the interpolation process and based on the sample data S16 and sample data S1.

As described above, since the phase for sampling the input data signal Vin varies gradually, the interpolation rate is changed based on the phase difference detected by the CRU 23. As illustrated in FIG. 6A, the interpolation of the data Dn is calculated based on preceding and subsequent sample data Sn−1 and Sn, respectively, with the following equation: $Dn = (1-k)*Sn-1 + k*Sn$, where k represents a decimal fraction between 0 and 1.

As illustrated in FIG. 6B, the example of DI 21 shown in FIG. 6A, includes two voltage-current converters 31A and 31B, which are also referred to as a gm 31A and a gm 31B, five switches SW1 to SW5, and two variable-capacitance capacitors CA and CB. The gm 31A, the switch SW1, and the variable-capacitance capacitor CA make up a first signal system coupled in series between an input terminal of the input data signal Vin and an output terminal of the interpolation data. The gm 31B, the switch SW2, and the variable-capacitance capacitor CB make up a second signal system coupled in series between the input terminal of the input data signal Vin and the output terminal of the interpolation data. In other words, the first signal system and the second signal system are coupled in parallel between the input terminal of the input data signal Vin and the output terminal of the interpolation data. The switch SW3 is coupled with the switch SW1, a coupling node of the variable-capacitance capacitor CA, and a high potential source. The switch SW4 is coupled with the switch SW2, a coupling node of the variable-capacitance capacitor CB, and the high potential source. The switch SW5 is coupled between the output terminal of the interpolation data and a low potential source. The actuating signals shown in FIG. 6C are applied to the switches in the example of DI 21 to perform the data interpolation process. A clock CLKn−1 is applied to the switch SW1, a clock CLKn is applied to the switch SW2, a clock CLKH is applied to the switches SW3 and SW4, and a clock CLKR is applied to the switch SW5. The operations of the DI 21 will be described later.

Figure 7:
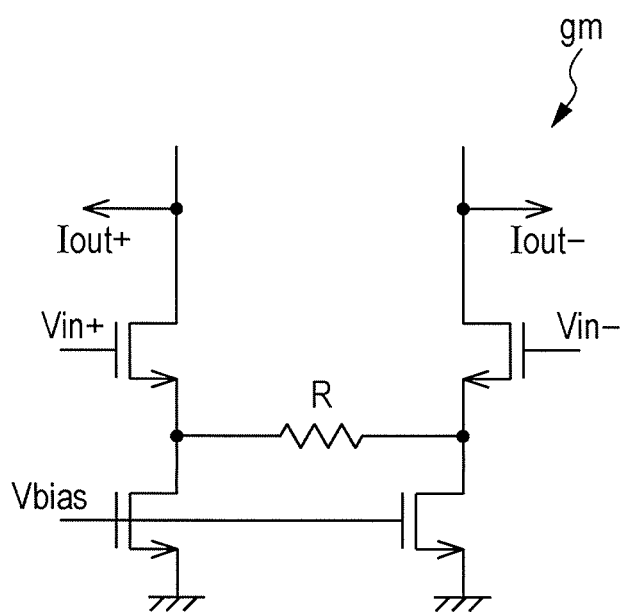
FIG. 7 is a diagram illustrating a circuit configuration of a differential-type voltage-current converter (gm)

FIG. 7 is a diagram illustrating an example circuit configuration of the differential-type gm 31A or 31B described with respect to FIGS. 6A to 6C. Each of the gms 31A and 31B is a voltage-current converter configured to cause a current to have a value corresponding to a voltage value of the input data signal Vin, and adjust a conversion gain by adjusting a resistance value of a resistor R coupled between a differential pair. In FIGS. 6A to 6C, the gms 31A and 31B operate to derive current from the variable-capacitance capacitors CA and CB.

Figure 8A:
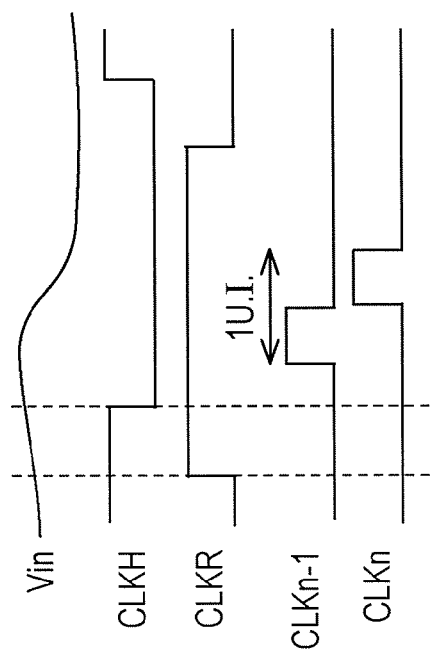
FIGS. 8A and 8B are diagrams illustrating operations of the DI illustrated in FIGS. 6A to 6C, where
Figure 8B:
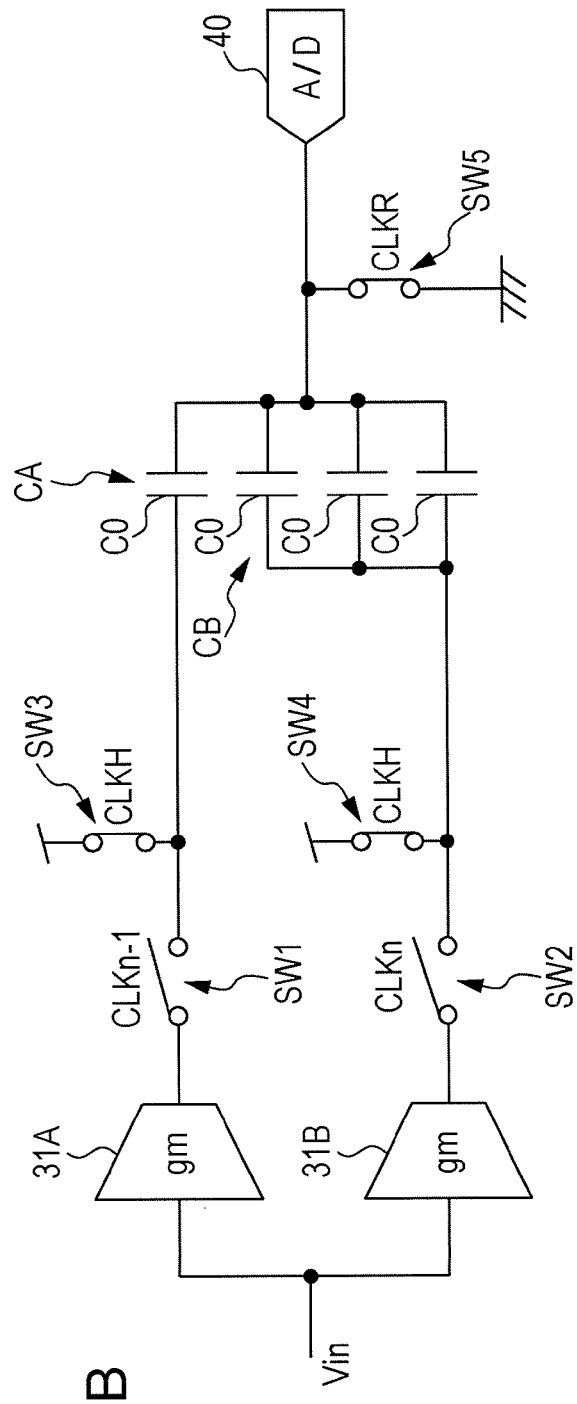
Figure 9A:
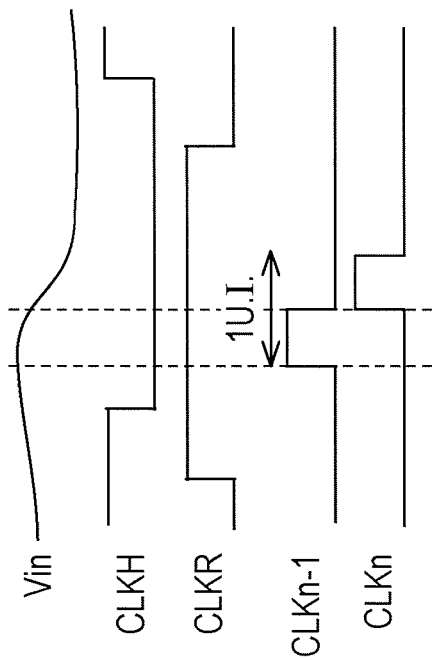
FIGS. 9A and 9B are diagrams illustrating operations of the DI illustrated in FIGS. 6A to 6C, where
Figure 9B:
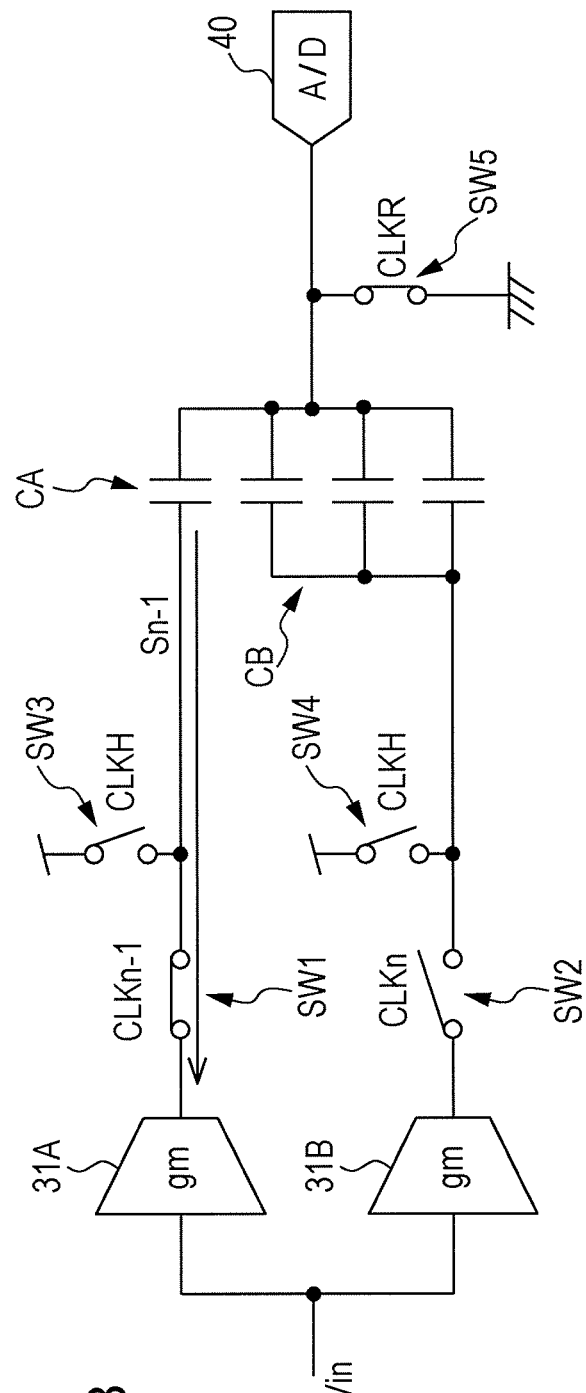
Figure 10A:
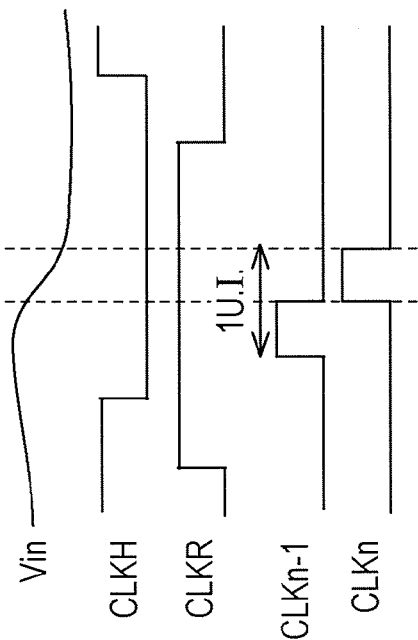
FIGS. 10A and 10B are diagrams illustrating an operation of the DI illustrated in FIGS. 6A to 6C, where

FIGS. 8A to 11B are diagrams illustrating operations of the examples of DI 21 illustrated in, and described with respect to, FIGS. 6A to 6C, and each of FIGS. 8A, 9A, 10A. More particularly, FIG. 11A illustrates signal waveforms while each of FIGS. 8B, 9B, 10B, and 11B illustrates coupling states of switches in various operation states. The variable-capacitance capacitors CA and CB may include a large number of capacitors CO with the same fixed capacitance value. Terminals of the capacitors CO on the output side are coupled to the output terminal of interpolation data in common, and the other terminals of the capacitors CO on the input side are selectively coupled to the switch SW1 or SW2. The capacitance values of the variable-capacitance capacitors CA and CB are changed by operating the coupling of the other terminals. As described below, the coupling of the other terminals is operated depending on the IC. In FIGS. 8A to 11B, four capacitors CO are shown, among which one of the capacitors CO is coupled to the switch SW1 and the other three capacitors CO are coupled to the switch SW2. Thus, the ratio of the capacitance value of the variable-capacitance capacitor CA to the capacitance value of the variable-capacitance capacitor CB is 1:3.

FIGS. 8A and 8B illustrate a state of a preparation period before the sampling for the data interpolation is performed twice. As illustrated in FIG. 8A, in this period, which is shown between dotted lines, CLKH="1", CLKR="1", and CLKn−1 and CLKn="0", where "1" indicates a coupled state and "0" indicates a cutoff state. Thus, as illustrated in FIG. 8B, the switches SW1 and SW2 are in the cutoff state, and the switches SW3, SW4, and SW5 are in the coupled state. As a result, a potential difference between the high potential source and the low potential source is applied to both ends of the variable-capacitance capacitors CA and CB and is charged into the variable-capacitance capacitors CA and CB. The charge amounts of the variable-capacitance capacitors CA and CB are the largest in this state.

FIGS. 9A and 9B illustrate a state in which the former of the two samples is performed. As illustrated in FIG. 9A, in this period, which is shown between dotted lines, CLKH="0", CLKR="1", CLKn−1="1", and CLKn="0". Thus, as illustrated in FIG. 9B, the switch SW1 is in the coupled state, the switches SW2, SW3, and SW4 are in the cutoff state, and the switch SW5 is in the coupled state. In this state, the gm 31A derives current corresponding to the input data signal Vin (e.g., the sample data Sn−1) at this timing from the variable-capacitance capacitor CA, and the charge amount of the variable-capacitance capacitor CA decreases by an amount corresponding to the sample data Sn−1. For example, when the sample data Sn−1 are large, the current derived by the gm 31A is large and the charge amount of the variable-capacitance capacitor CA becomes small. In contrast, when the sample data Sn−1 are small, the current derived by the gm 31A is small and the charge amount of the variable-capacitance capacitor CA remains large. In both examples, the charge amount of the variable-capacitance capacitor CB remains unchanged.

Figure 10B:
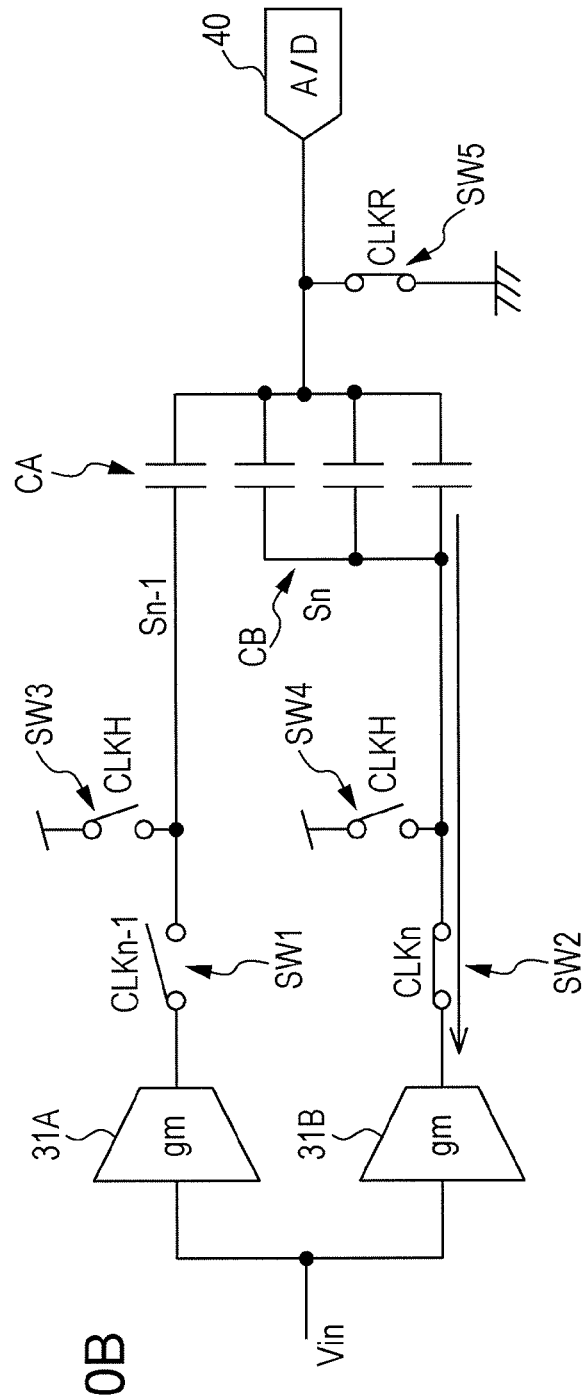

FIGS. 10A and 10B illustrate a state in which the latter of the two samples is performed. As illustrated in FIG. 10A, in this period, which is shown between dotted lines, CLKH="0", CLKR="1", CLKn−1="0", and CLKn="1". Thus, as illustrated in FIG. 10B, the switch SW12 is in the coupled state, the switches SW1, SW3, and SW4 are in the cutoff state, and the switch SW5 is in the coupled state. In this state, the gm 31B derives current corresponding to the input data signal Vin (e.g., the sample data Sn) at this timing from the variable-capacitance capacitor CB, and the charge amount of the variable-capacitance capacitor CB decreases by an amount corresponding to the sample data Sn. The charge amount of the variable-capacitance capacitor CA remains unchanged in FIGS. 10A and 10B from the state in FIGS. 9A and 9B.

Figure 11A:
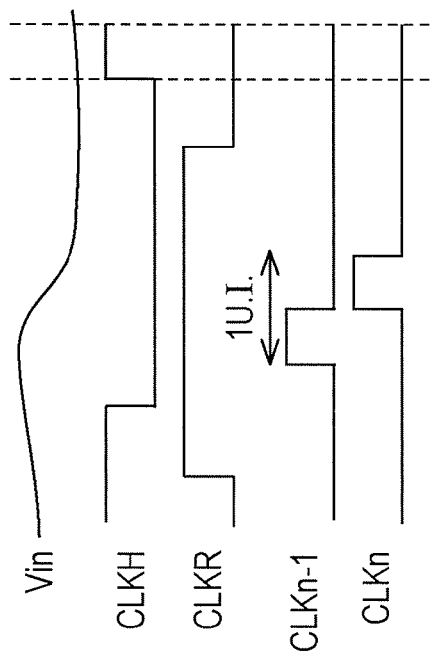
FIGS. 11A and 11B are diagrams illustrating the DI illustrated in FIGS. 6A to 6C, where
Figure 11B:
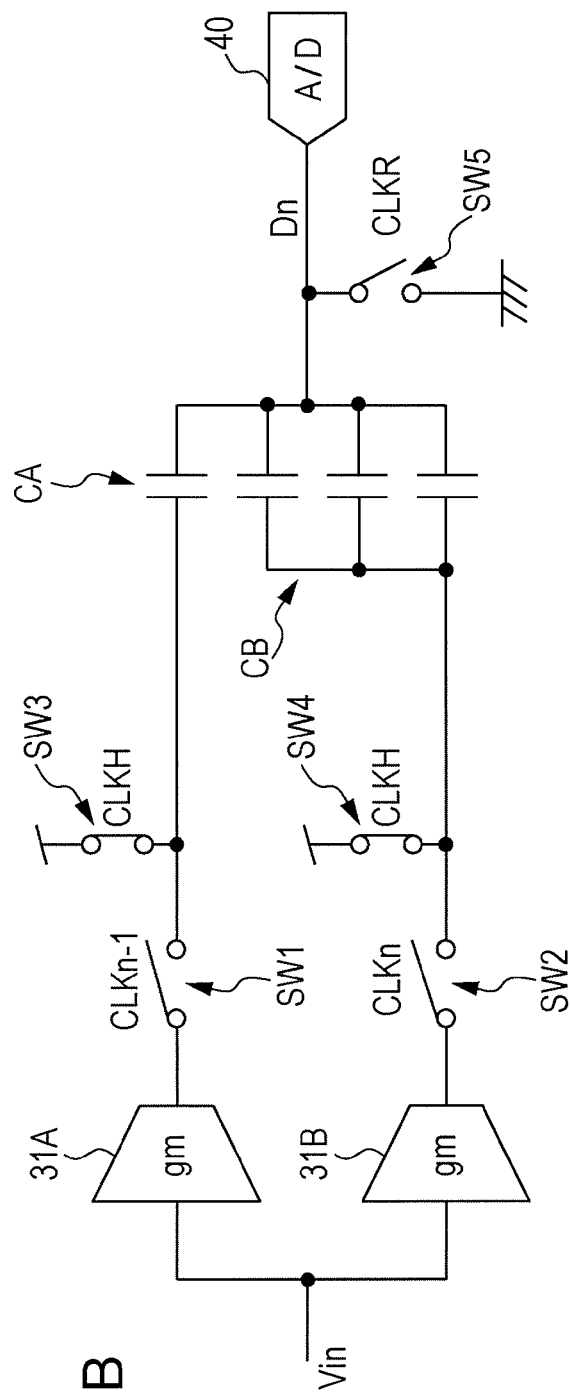

FIGS. 11A and 11B illustrate a state in which the sample data obtained in the two samples are combined to output the interpolation data. As illustrated in FIG. 11A, in this period, which is shown between dotted lines, CLKH="1", CLKR="0", and CLKn−1=CLKn="0". Thus, as illustrated in FIG. 11B, the switches SW1 and SW2 are in the cutoff state, the switches SW3 and SW4 are in the coupled state, and the switch SW5 is in the cutoff state. In this state, a voltage of the data Dn obtained by combining the remaining charge amount of the variable-capacitance capacitor CA corresponding to the sample data Sn−1 and the remaining charge amount of the variable-capacitance capacitor CB corresponding to the sample data Sn at the ratio between the capacitances of the variable-capacitance capacitors CA and CB is output to the output terminal of the interpolation data.

The interpolation data from the voltage of the data Dn are converted into reception data through an analog-to-digital (AD) converter 40 or a comparator. The operations of the above-described DI 21 involve a preparation period before the sampling, a sampling period, and a data combining and outputting period. Thus, continuous sampling may not be performed with a single DI 21. Accordingly, a plurality of DIs 21 may be provided to have an interleaving configuration. Specifically, among the plurality of DIs 21, after the first DI 21 ends a process for a first period and starts a subsequent process, the second DI 21 may be configured to start a process for the first period. Thereafter, subsequent processes may be performed in order, and when the first DI 21 ends a process for the last period, the first DI 21 may start the processes again and similar operations may continue to be repeated. Thus, the number of DIs 21 is desired to be equal to or more than the number of process periods, and in the examples of FIGS. 8A to 11B, four or more DIs may be included with an interleaving configuration. In practice, the number of DIs may be further increased so that the interpolation rate may be changed.

In addition, one piece of sample data may be used in a certain period in order to generate the interpolation data between the sample data and the immediately preceding sample data. The piece of sample data also may be used in a subsequent period in order to generate the interpolation data between the sample data and the immediately subsequent sample data. Thus, it is possible to use the gm 31A and the gm 31B in common.

Figure 12:
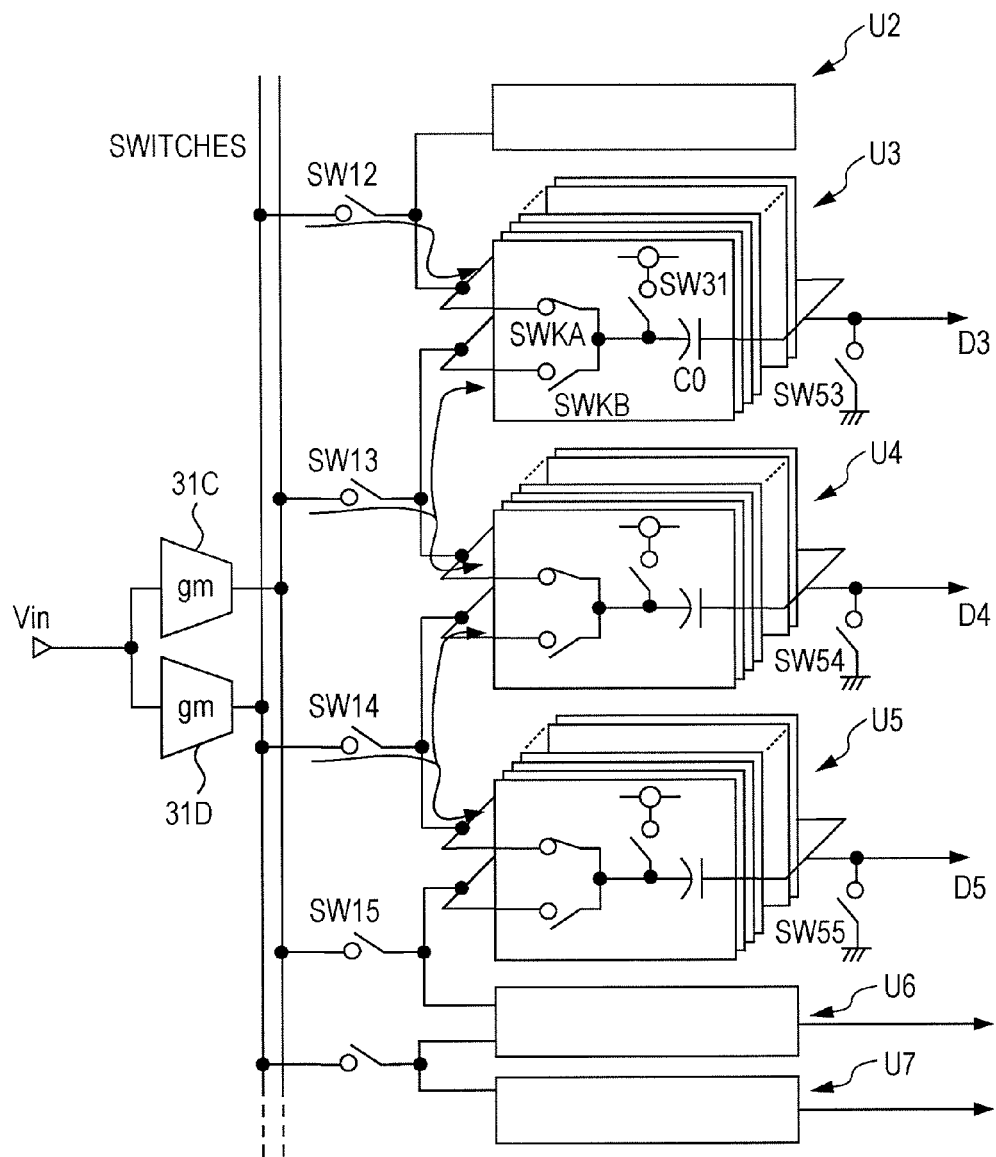
FIG. 12 is a diagram illustrating a configuration of an interleaving-type DI having an interleaving configuration in which gms are used in common.

FIG. 12 is a diagram illustrating a configuration of an example of an interleaving-type DI having the above-described interleaving configuration in which the gms 31A and 31B are used in common. The interleaving-type DI includes m number of operation units U0 to Um−1. Each of the operation units includes N number of circuit units. Each of the circuit units includes one capacitor CO, a switch SW31 between one terminal of the capacitor CO and the high potential source, and two switches SWKA and SWKB coupled to the one terminal of the capacitor CO. The other terminal of each of the capacitors CO in the N number of circuit units of each operation unit is coupled to an interpolation data output terminal of each operation unit in common with the other capacitors CO in the same operation unit. Switches SW50 to SWm−1 are provided between the interpolation data output terminal of each operation unit and a low potential source. The switches SWKA of the N number of circuit units of each operation unit are coupled to one another and coupled to a switch, which is itself coupled to one of the gm 31C and the gm 31D. The switches SWKB of the N number of circuit units of each operation unit are coupled to one another and coupled to a switch, which is itself coupled to the other one of the gm 31C and the gm 31D. For example, in FIG. 12, the switches SWKA of the N number of circuit units of the operation unit U3 are coupled to one another and coupled to the gm 31D through the switch SW12. Also, the switches SWKB of the N number of circuit units of the operation unit U3 are coupled to one another and coupled to the gm 31C through the switch SW13. Since the switches SWKA of the N number of circuit units of the operation unit U4 are also coupled to the switch SW13, the switches SWKB of the operation unit U3 and the switches SWKA of the operation unit U4 are coupled in common.

For example, when the interpolation data are generated based on the equation, $Dn=(1-k)*Sn-1+k*Sn$, k is a value between 0 and 1, which is different from . . . by 1/N. In this case, among the N number of circuit units of the operation unit U3, the switches SWKA are operated into the coupled state and the switches SWKB are operated into the cutoff state in the N-Nk number of circuit units, while the switches SWKA are operated into the cutoff state and the switches SWKB are operated into the coupled state in the Nk number of circuit units.

The data interpolation process performed in the operation unit U3 is now described. In the preparation period described with respect to FIGS. 8A and 8B, the switches SW12 and SW13 are in the cutoff state and the switch SW53 is in the coupled state. while in the N number of circuit units of the operation unit U3, the switch SW31 is in the coupled state and the N number of capacitors CO are charged. In the former sampling period described with respect to FIGS. 9A and 9B, the switch SW31 is in the cutoff state, the switch SW12 is in the coupled state, the switch SW13 is in the cutoff state, and the switch SW53 is in the coupled state. Accordingly, the output of the gm 31D derives current from the capacitors CO of the N-Nk number of circuit units via the switch SW12, and the switches SWKA of the N-Nk number of circuit units of the operation unit U3. In the latter sampling period described with respect to FIGS. 10A and 10B, the switch SW12 is in the cutoff state and the switch SW13 is in the coupled state. Accordingly, the output of the gm 31C derives current from the capacitors CO of the Nk number of circuit units via the switch SW13, and the switches SWKB of the Nk number of circuit units of the operation unit U3. As such, current is also extracted from the capacitors CO of the N-Nk number of circuit units of the operation unit U4. Further, in the combining and outputting period described with respect to FIGS. 11A and 11B, the switches SW12 and SW13 are in the cutoff state, the switch SW53 is in the coupled state, and interpolation data D3 are output. Such operations may be performed while shifting the units every half cycle period of a clock.

The data interpolation process may be performed continuously as described above. The above-described examples are non-limiting and, as such, neither the variable-capacitance capacitor nor the number of interleaving operations of the circuits are limited to a particular configuration or number.

In the above-described DI 21 example, it may be desired that the gms 31A and 31B, and the gms 31C and 31D, have the same conversion characteristics and that the total amount of the capacitances on the sides of the gms 31A and 31B, and the gms 31C and 31D, are uniform at, for example, all times. If the total amount of the capacitances is not uniform, that is for example, if the capacitances increase, the amount of electric charge stored per a capacitance unit may decrease and thus, correct sample values may not be obtained.

Figure 13:
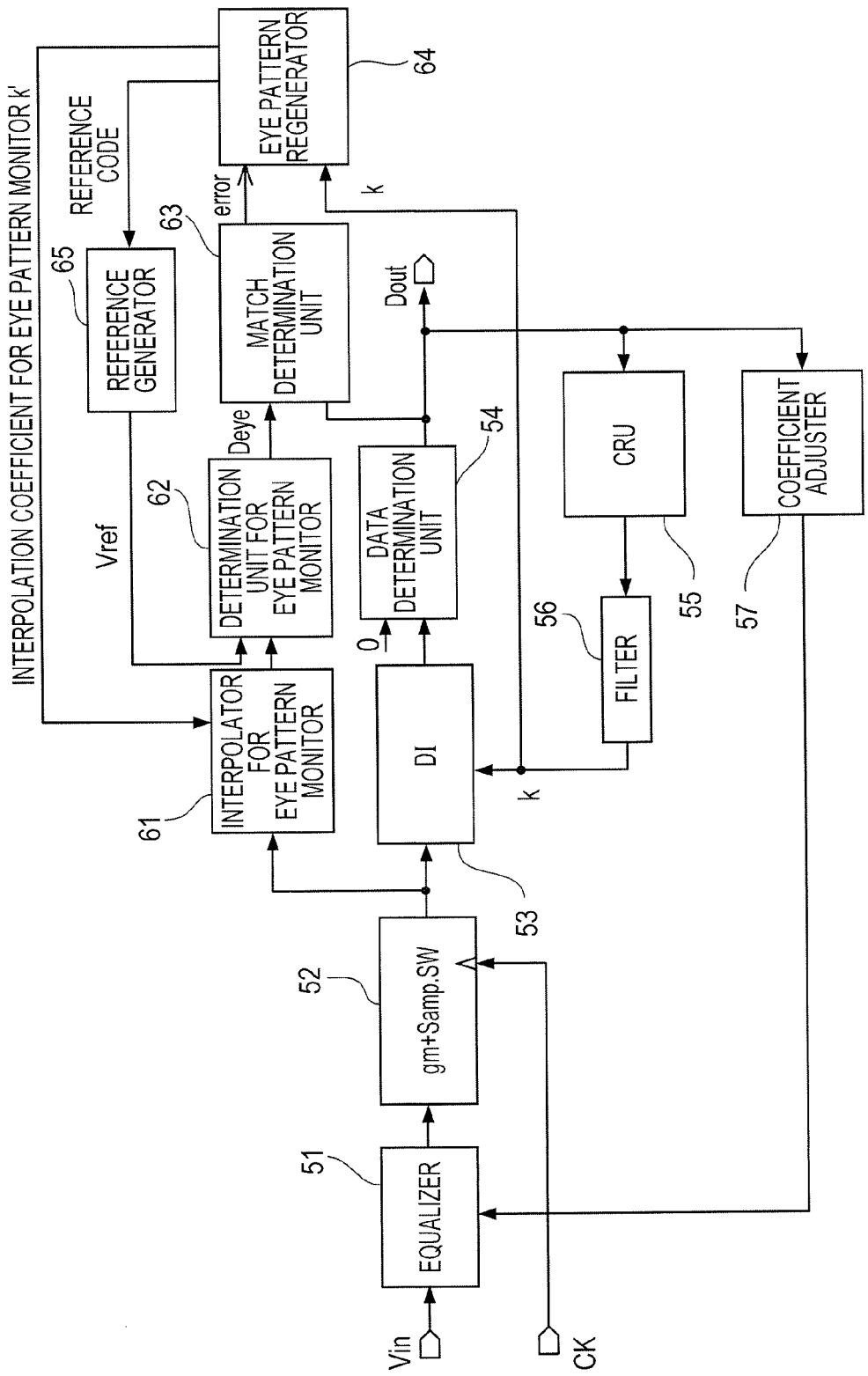
FIG. 13 is a block diagram illustrating a configuration of a blind-type receiver circuit according to a first embodiment.

FIG. 13 is a block diagram illustrating an example configuration of a blind-type receiver circuit according to the first embodiment. The receiver circuit according to the first embodiment includes an equalizer 51, a voltage-current converter, and a sample circuit 52, also referred to as a gm+Samp.SW 52, a data interpolator (DI) 53, a data determination unit 54, a clock recovery unit (CRU) 55, a filter 56, and a coefficient adjuster 57. Further, the receiver circuit according to the first embodiment includes an interpolator for an eye pattern monitor 61, a determination unit for the eye pattern monitor 62, a match determination unit 63, an eye pattern regenerator 64, and a reference generator 65.

The equalizer 51 is a circuit configured to compensate for degradation caused in a transmission system of the input data signal Vin and correct signal rounding with a high-pass filter.

The gm+Samp.SW 52 is a circuit obtained by adding a sample and hold function to a gm that causes a current value dependent on a voltage value of an output signal of the equalizer 51. In one example, the gm may be the circuit in FIG. 7.

The DI 53 may correspond to the DI 21 in FIGS. 3A and 3B and may be, for example, the circuit in FIG. 12.

The data determination unit 54 may correspond to the determination unit 22 in FIGS. 3A and 3B, and in one example, may be a comparator. The data determination unit 54 is configured to compare the interpolation data output from the DI 53 with a central level, which is a "0" level. The CRU 55 may be, for example, the CRU 23 illustrated in FIG. 4A, and the circuit described above may be used, depending on the resolution of the phase detection.

The filter 56 outputs an interpolation rate k obtained by removing high-frequency components of the phase difference detected by the CRU 55.

The coefficient adjuster 57 is a circuit that adjusts a coefficient at the time of feeding back a preceding data value to the equalizer 51 based on the output data Dout. As illustrated in FIG. 13, the receiver circuit normally includes the equalizer 51 at the first stage, and compensates for loss of a communication channel between the transmission circuit and the receiver circuit. The feedback process of the equalizer involves a coefficient, such as an equalization strength coefficient, and the coefficient is adaptively controlled by being employed from among calculated results based on an output data sequence using the coefficient adjuster 57.

The eye pattern monitor in the first embodiment serves to observe the eye pattern actually perceived by the data determination unit 54 after the equalizer 51 has performed the compensation.

The interpolator for the eye pattern monitor 61 may be, for example, a circuit similar to the DI 53 and the interpolation rate may be set based on an interpolation coefficient for the eye pattern monitor k' from the eye pattern regenerator 64.

Similar to the data determination unit 54, the determination unit for the eye pattern monitor 62 may be a comparator configured to compare the interpolation data for the eye pattern monitor output from the interpolator for the eye pattern monitor 61 with a reference voltage Vref output from the reference generator 65.

The match determination unit 63 determines whether a determination result of the determination unit for the eye pattern monitor 62 matches a determination result of the data determination unit 54, that is, the reception data. When the determination results match, the match determination unit 63 determines a normal result; however, when the determination results do not match, the match determination unit 63 determines an abnormal result and outputs an error signal error.

The eye pattern regenerator 64 causes the interpolator for the eye pattern monitor 61 to perform a sweep operation for generating the interpolation data for the eye pattern monitor over the whole phase in order to generate the eye pattern. Further, the eye pattern regenerator 64 determines a range in which the interpolation data for the eye pattern monitor are determined to be normal in each phase, that is, a range of the reference voltage in which the match determination unit 63 outputs no error signal. This is the eye pattern. Thus, the eye pattern regenerator 64 learns a position of the reception data, which is a 180-degree phase position, based on the interpolation rate k from the filter 56. The eye pattern regulator 64 also calculates the interpolation coefficient for the eye pattern monitor k' for setting a sweep position and outputs the interpolation coefficient for the eye pattern monitor k' to the interpolator for the eye pattern monitor 61. Further, the eye pattern regenerator 64 generates a reference code for generating the reference voltage and outputs the reference code to the reference generator 65.

The reference generator 65 generates the reference voltage Vref based on the reference code and outputs the reference voltage Vref to the determination unit for the eye pattern monitor 62.

The eye pattern regenerator 64 causes the collected information on the eye pattern to be stored in a register, and suitably outputs the collected information to an external device. The values stored in the register may be cleared after being read out to the external device.

FIGS. 14A to 14C illustrate examples of a register in which the collected information on the eye pattern is stored. As illustrated in FIG. 14A, the coordinates of a lattice point in the time axis (e.g., phase) direction and the voltage (e.g., signal intensity) direction are stored by correlating the number of errors RE and the number of samples RS with a time T and a voltage V. The coordinates in the time axis direction are calculated based on the interpolation code received from the CRU 55 and the filter 56 and the interpolation coefficient for the eye pattern monitor k'. The coordinates in the voltage direction are calculated based on the reference code output to the reference generator 65.

The eye pattern regenerator 64 counts a number matches and a number of non-matches regarding each coordinate for a certain number of times N, and causes the count results and the coordinates information to be stored in the register and/or some other data storage component.

FIG. 14B illustrates an example of a simplified register. It may be desirable for the register in FIG. 14A to have a large amount of storage capacity (relative to . . . ) for storing the information on all lattice points. As the number of lattice points increases, the circuit area may also increase accordingly, and, further, it may take more time to provide outputs. Thus, as illustrated in FIG. 14B, a work register may be prepared so that measurement results of one or more times may be stored as the number of errors RE(T,V) and the number of samples RS(T,V) correlated with the time T and the voltage V and may be output as occasions arise.

As illustrated in FIG. 14C, a register for the lattice point in the time axis direction may be provided so that the measurement results may be stored as the number of errors RE(V) and the number of samples RS(V) correlated with the voltage V.

The number of samples N may be set as desired. If a logical value "1" is set when the match determination unit 63 indicates a match and if a logical value "0" is set when the match determination unit 63 indicates no match, a shmoo plot may be obtained by taking a logical OR of the N times of trials. Further, a bit error rate (BER) map that indicates the BER in stages may be generated by increasing the value of N.

Figure 15:
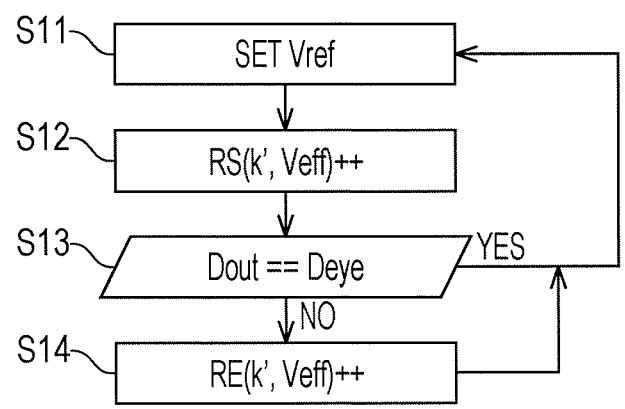
FIG. 15 is a flow chart illustrating a method of eye pattern measurement according to the first embodiment.

FIG. 15 is a flow chart illustrating a method of eye pattern measurement according to the first embodiment. In operation S11, the eye pattern regenerator 64 outputs the reference code to the reference generator 65. Also in operation S11, the reference generator 65 generates the reference voltage Vref based on the reference code and outputs the reference voltage Vref to the determination unit for the eye pattern monitor 62. For example, the reference code may be generated so that the reference voltage Vref may consistently increase or decrease by one level or may gradually increase or decrease alternately from a central level. The determination unit for the eye pattern monitor 62 generates an actual reference voltage Veff that is set based on the reference voltage Vref. Thus, the determination may be performed on the output of the interpolator for the eye pattern monitor 61 in the determination unit for the eye pattern monitor 62. Further, the eye pattern regenerator 64 outputs the interpolation coefficient for the eye pattern monitor k' to the interpolator for the eye pattern monitor 61, and the interpolator for the eye pattern monitor 61 switches the coupling of the capacitors of the interpolator based on the interpolation coefficient for the eye pattern monitor k'.

In operation S12, the number of samples RS(k',Veff) at the time (e.g., phase) T corresponding to the interpolation coefficient for the eye pattern monitor k' and the voltage V corresponding to the actual reference voltage Veff is incremented by one. In operation S13, it is determined whether the determination result of the data determination unit 54 matches the determination result of the determination unit for the eye pattern monitor 62. If a match is determined, the process returns to operation S11; if no match is determined, the process proceeds to operation S14.

In operation S14, after the number of errors RE(k',Veff) corresponding to the time (e.g., phase) T and the voltage V is incremented by one, the process returns to operation S11. Thereafter, the above-described operations (e.g., S11, S12, S13, and S14) may be repeated.

As described above, the receiver circuit according to the first embodiment performs the sweep over the whole phase in order to generate the interpolation data for the eye pattern monitor, determines the width of the eye pattern at each sweep position, which is an interpolation position of the interpolation data for the eye pattern monitor, and generates an eye pattern.

Since the receiver circuit according to the first embodiment generates an eye pattern with the interpolator for the eye pattern monitor 61, which may be the same as or similar to the DI illustrated in FIG. 12, the circuit size may increase. Thus, in the second embodiment, the configuration of the interpolator for the eye pattern monitor 61 may be simplified as compared with that of the first embodiment.

Second Embodiment

Figure 16:
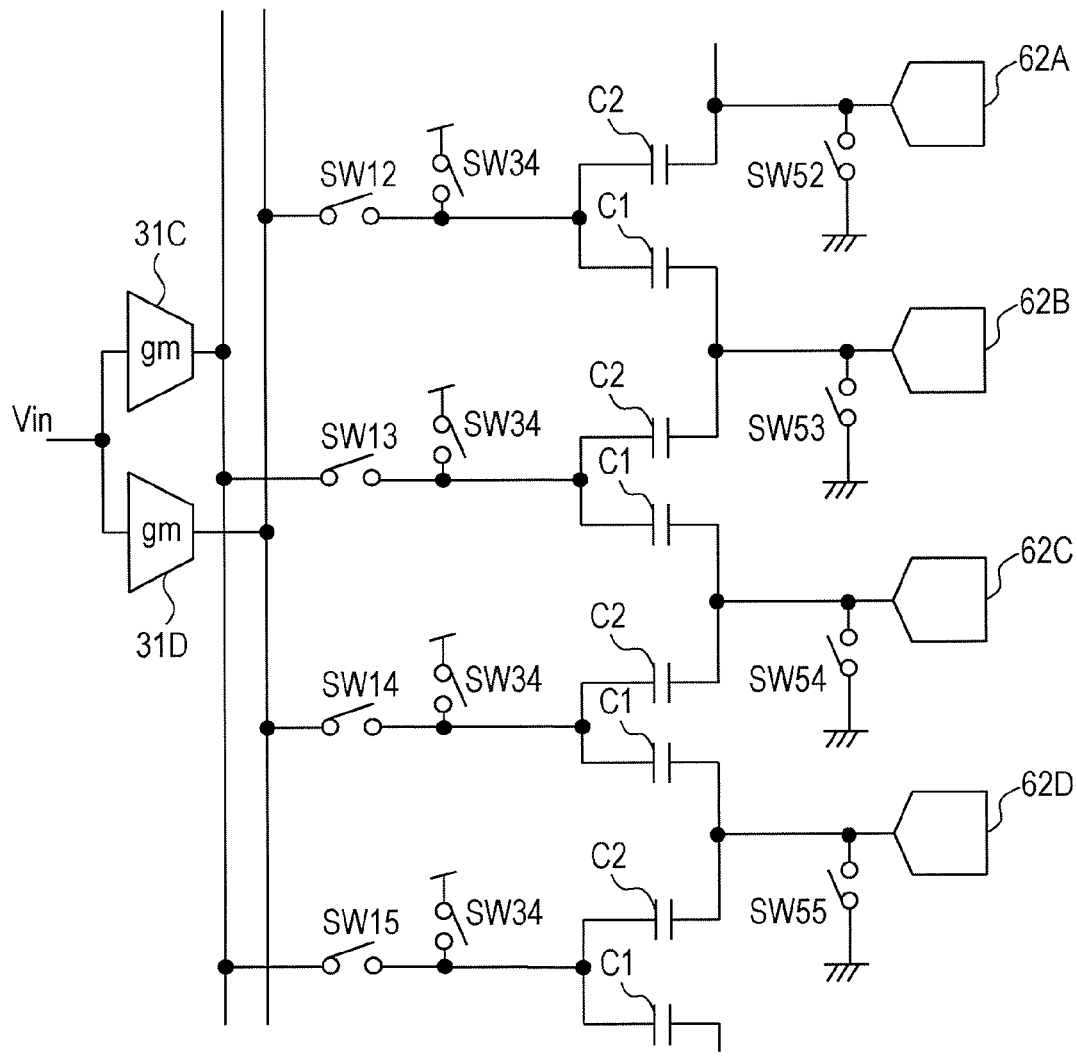
FIG. 16 is a diagram illustrating a circuit configuration of an interpolator for an eye pattern monitor in a receiver circuit according to a second embodiment.

FIG. 16 is a diagram illustrating an example circuit configuration of an interpolator for an eye pattern monitor 61 in a receiver circuit according to a second embodiment. The interpolator for the eye pattern monitor 61 according to the second embodiment may be different from the receiver circuit according to the first embodiment in that the capacitances of the variable-capacitance capacitors CA and CB illustrated in FIG. 8B are fixed. However, the other aspects of the eye pattern monitor 61 according the second embodiment may be the same as, or similar to, the aspects described above with respect to the eye pattern monitor 61 according to the first aspect.

In FIG. 16, a switch SW34 may correspond to the switch SW31 provided to each circuit unit in FIG. 12. References 62A to 62D denote AD converters that make up a determination unit for the eye pattern monitor 61. A fixed-capacitance capacitor C1 corresponds to the variable-capacitance capacitor CA, a fixed-capacitance capacitor C2 corresponds to the variable-capacitance capacitor CB, and the ratio between the capacitances of the fixed-capacitance capacitors C1 and C2 may be used to determine an interpolation coefficient for the eye pattern monitor k'. In other words, in the second embodiment, the interpolation coefficient for the eye pattern monitor k' is uniform and unchanged. For example, when the capacitance values of the fixed-capacitance capacitors C1 and C2 are set to the same value, an intermediate value of actual samples is obtained as the interpolation data for the eye pattern monitor. The operation of the interpolator for the eye pattern monitor 61 in FIG. 16 may be the same or similar to the operation as described with respect to FIGS. 8A to 11B. As such, no further description is provided here.

In a case where operation clock frequencies of the transmission circuit and the receiver circuit do not agree, a phase of a received data signal relative to a clock of the receiver circuit gradually varies, depending on an offset of the operation clock frequencies. Thus, when the interpolation coefficient for the eye pattern monitor k' is uniform, an interpolation position or the phase of the interpolation data for the eye pattern monitor in the data signal gradually changes. In other words, a sweep is performed on the interpolation data for the eye pattern monitor automatically.

Figure 17A:
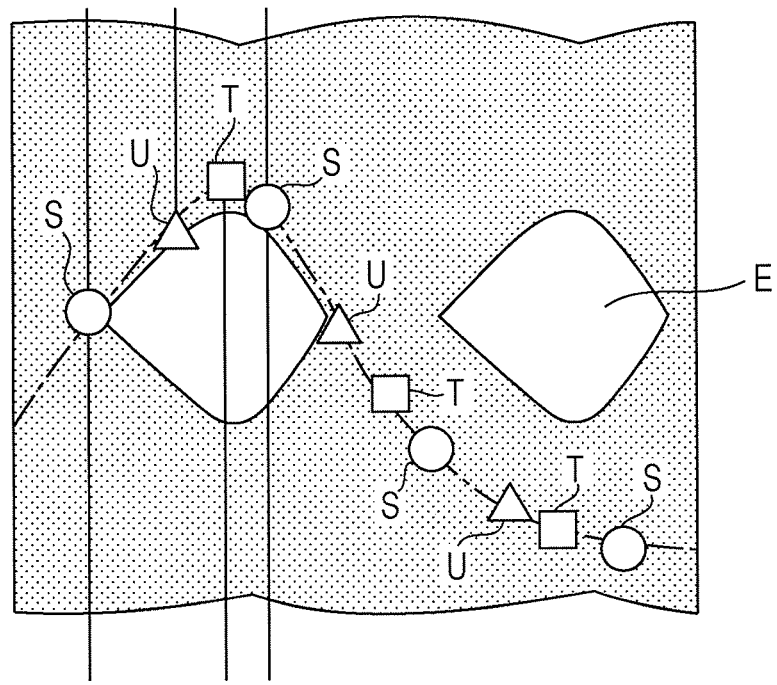
FIGS. 17A and 17B are diagrams illustrating generation of an eye pattern monitor according to the second embodiment when capacitances of two fixed-capacitance capacitors are the same, where
Figure 17B:
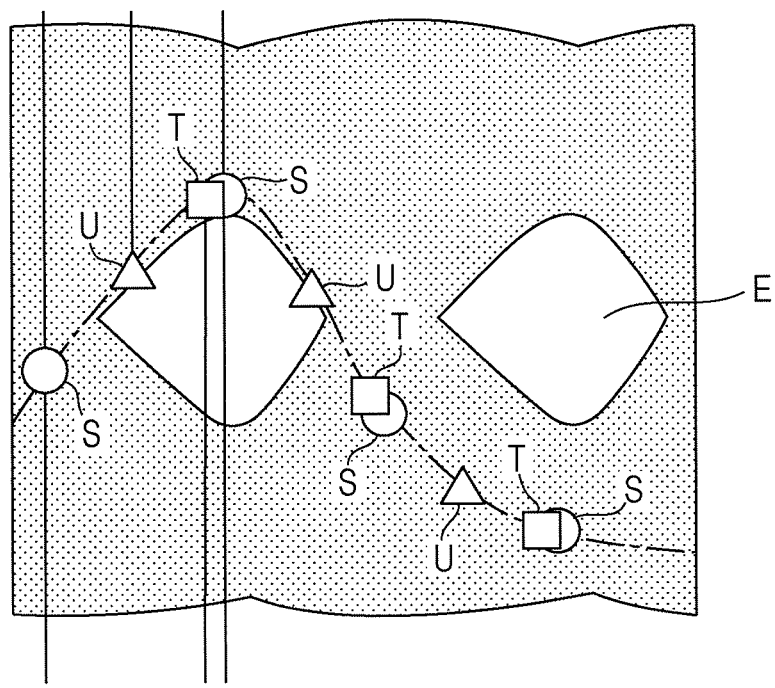

FIGS. 17A and 17B are diagrams illustrating generation of the eye pattern monitor according to the second embodiment while the capacitances of the fixed-capacitance capacitors C1 and C2 have the same value. FIG. 17A illustrates a case in which an interpolation rate k of a DI 53 is 0.8 and FIG. 17B illustrates a case in which the interpolation rate k of the DI 53 is 0.9. In FIGS. 17A and 17B, S denotes actual sample data without synchronization, T denotes interpolation data used for actual data determination, and U denotes the interpolation data for the eye pattern monitor.

In FIG. 17A, the interpolation rate k is 0.8, the interpolation data T indicates a voltage corresponding to a position at which two pieces of the actual sample data are internally divided so that the ratio is 2:8, and the position corresponds to a central position of the input data signal during the transition, which is at 180 degrees. The interpolation data for the eye pattern monitor U appears at an intermediate position between the two pieces of the actual sample data.

In FIG. 17B, the interpolation rate k is 0.9, the interpolation data T indicates a voltage corresponding to a position at which the two pieces of the actual sample data are internally divided so that the ratio is 1:9, and the position follows the central position of the input data signal during the transition, which is at 180 degrees. The interpolation data for the eye pattern monitor U are at an intermediate position between the two pieces of the actual sample data, and move in accordance with the phase shift of the actual sample data as illustrated.

As described above, the sweep may be performed on the interpolation data for the eye pattern monitor U throughout the time axis of the eye pattern. It is possible to calculate backward a location in the lattice points corresponding to the interpolation data for the eye pattern monitor U based on the interpolation rate k output from the filter 56 and the interpolation coefficient for the eye pattern monitor k'.

In the second embodiment, the interpolation rate of the interpolation data for the eye pattern monitor is unable to be set as desired and thus, a desired sweep operation may not be performed. Accordingly, for example, the measurement of the eye pattern information may be continuously performed, a value (e.g., phase) T in the time axis at the measurement, and a reference voltage Vref may be combined and stored, and a large number of measurements may be performed to collect information desired in order to measure the eye pattern. If all the information thus collected is stored and output, the circuit size increases and more time may be needed to output the information. Thus, when the value (e.g., phase) T in the time axis, for which the measurement is desired, is a desired value, that is, when the values of the interpolation rate k and the interpolation coefficient for the eye pattern monitor k' reach desired values after a wait for the desired values, the measurement is performed. Aspects related to this case are described next.

Figure 18:
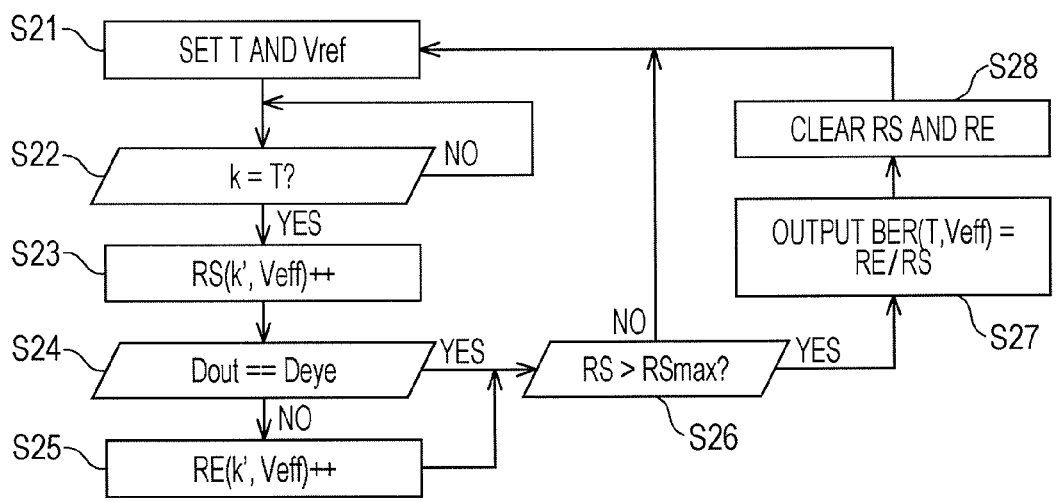
FIG. 18 is a flow chart illustrating a method of eye pattern measurement according to the second embodiment.

FIG. 18 is a flow chart illustrating a method of eye pattern measurement according to the second embodiment. In operation S21, which may be similar to operation S11 as described with respect to the first embodiment, an eye pattern regenerator 64 outputs a reference code to a reference generator 65. Also in operation S21, the reference generator 65 generates the reference voltage Vref based on the reference code and outputs the reference voltage Vref to the determination unit for the eye pattern monitor 62. The determination unit for the eye pattern monitor 62 generates an actual reference voltage Veff based on the reference voltage Vref and sets the actual reference voltage Veff for the circuit. The eye pattern regenerator 64 determines the interpolation rate k and the interpolation coefficient for the eye pattern monitor k' corresponding to the time (e.g., phase) T, which is a position in the time axis and is desired to be further measured. The eye pattern regenerator 64 outputs the interpolation coefficient for the eye pattern monitor k' to the interpolator for the eye pattern monitor 61. The interpolator for the eye pattern monitor 61 switches the coupling of the internal capacitors based on the interpolation coefficient for the eye pattern monitor k'.

In operation S22, the eye pattern regenerator 64 determines whether the interpolation rate k has reached the determined value and, if not, waits until the interpolation rate k does so. When the interpolation rate k indicates the determined value, the process proceeds to operation S23. Meanwhile, and also in operation S22, the interpolator for the eye pattern monitor 61 performs the interpolation process based on the interpolation coefficient for the eye pattern monitor k', and the determination unit for the eye pattern monitor 62 performs a process of comparison with the actual reference voltage Veff. When the determination unit for the eye pattern monitor 62 determines whether the interpolation rate k has reached the value corresponding to the time T desired to be measured (e.g., and the determination unit waits until, and then determines that, the interpolation rate k indicates the value corresponding to the time T) the process proceeds to operation S25.

Operations S23 to S25 may be the same as or similar to operations S14 to S16 described with respect to the first embodiment. Upon completion of operation S24 and/or S25, the method proceeds to operation S26.

In operation S26, it is determined whether the number of samples RS has reached a certain number of samples Rsmax. If the number of samples RS has not reached the number of samples RSmax, the process returns to operation S21. If the number of samples RS has reached the number of samples RSmax, the process proceeds to operation S27.

In operation S27, a BER, which is equal to RE/ES, for each time T and each actual reference voltage Veff is output.

In operation S28, the number of samples RS and the number of errors RE may be cleared and the method returns to operation S21.

Figure 19A:
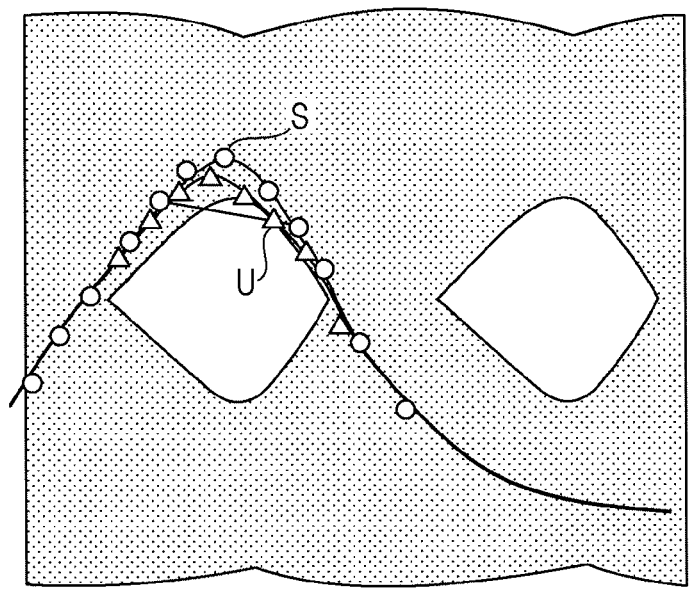
FIGS. 19A and 19B are diagrams illustrating a difference in interpolation data (e.g., the eye pattern) for the eye pattern monitor dependent on a data interpolation rate for the eye pattern monitor, where
Figure 19B:
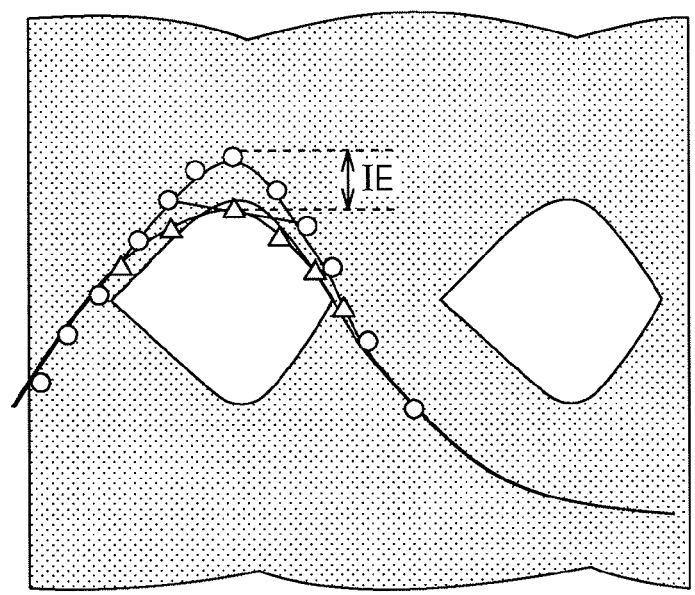

Next, a fixed data interpolation rate for the eye pattern monitor in the interpolator for the eye pattern monitor 61 according to the second embodiment is described. FIGS. 19A and 19B are diagrams illustrating a difference in the interpolation data for the eye pattern monitor (e.g., the eye pattern) dependent on the data interpolation rate for the eye pattern monitor. More particularly, FIG. 19A illustrates a case in which the data interpolation rate for the eye pattern monitor is 0.9, while FIG. 19B illustrates a case in which the data interpolation rate for the eye pattern monitor is 0.5.

As may be seen by comparing FIG. 19A with FIG. 19B, when the data interpolation rate for the eye pattern monitor is different, the interpolation data for the eye pattern monitor to be obtained also differs. When the data interpolation rate for the eye pattern monitor is 0.5, that is, the interpolation rate for a case in which C1:C2 is 1:1 as illustrated in FIG. 19B, the amplitude of the eye pattern is the smallest. In other words, in FIG. 19B, an interpolation error IE, which is a difference between the actual sample data and the interpolation data, is the largest when the data interpolation rate for the eye pattern monitor is 0.5. Thus, it is desired that the data interpolation rate for the eye pattern monitor indicates a value near "0" or "1."

As described above, the interpolator for the eye pattern monitor 61 according to the second embodiment may suppress the increase in circuit size and reduce an area, compared with the case in which a dual configuration is applied to the DI as in the first embodiment. In addition, the eye pattern monitor may be operated without stopping ordinary communications and is advantageous functionally, for example, in that no specific input pattern is needed for error determination, compared to a typical eye pattern monitor.

Although the DI 53 and the interpolator for the eye pattern monitor 61 are described separately in the first embodiment and the second embodiment, a large number of elements, such as the switches, that perform the same or similar operations are included in the DI 53 as per both embodiments. Thus, in a third embodiment and a fourth embodiment, the circuit size may be reduced by using part of the DI 53 and the interpolator for the eye pattern monitor 61 in common.

Third Embodiment

Figure 20:
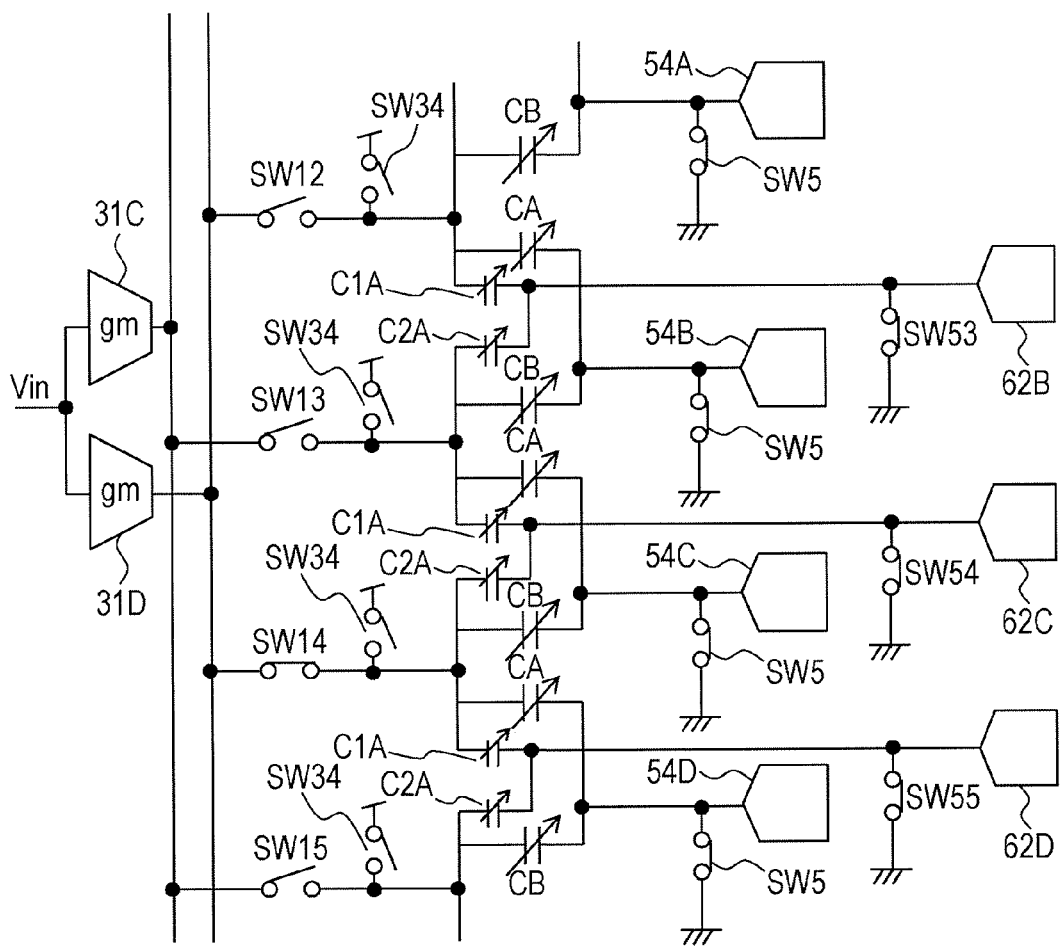
FIG. 20 is a diagram illustrating a configuration of an interpolator of a receiver circuit according to a third embodiment.

FIG. 20 is a diagram illustrating an example configuration of an interpolator of a receiver circuit according to the third embodiment. In the interpolator of the third embodiment, the switches of the DI 53 as described with respect to the first embodiment and the interpolator for the eye pattern monitor 61 are used in common. The receiver circuit according to the third embodiment may be the same as, or similar to, the receiver circuit according to the first embodiment. However, the interpolator of the receiver circuit may be different from that described with respect to the first embodiment.

In FIG. 20, references 54A to 54D denote AD converters that make up a data determination unit 54. Variable-capacitance capacitors CA and CB correspond to the variable-capacitance capacitors CA and CB and correspond to the two sets, into which the plurality of capacitors CO of each operation unit are divided in FIG. 12. The division into the two sets may be adjusted, depending on the interpolation rate k. Variable-capacitance capacitors C1A and C2A correspond to the variable-capacitance capacitors CA and CB in the interpolator for the eye pattern monitor 61 and correspond to two sets, into which the plurality of capacitors CO of each operation unit are divided in FIG. 12. The division into the two sets may be adjusted, depending on the interpolation coefficient for the eye pattern monitor for performing a sweep. A switch SW5 corresponds to the switch SW5 in FIG. 8B. The various operations of the receiver circuit according to the third embodiment may be the same as, or similar to, the various operations of the receiver circuit according to the first embodiment.

Fourth Embodiment

Figure 21:
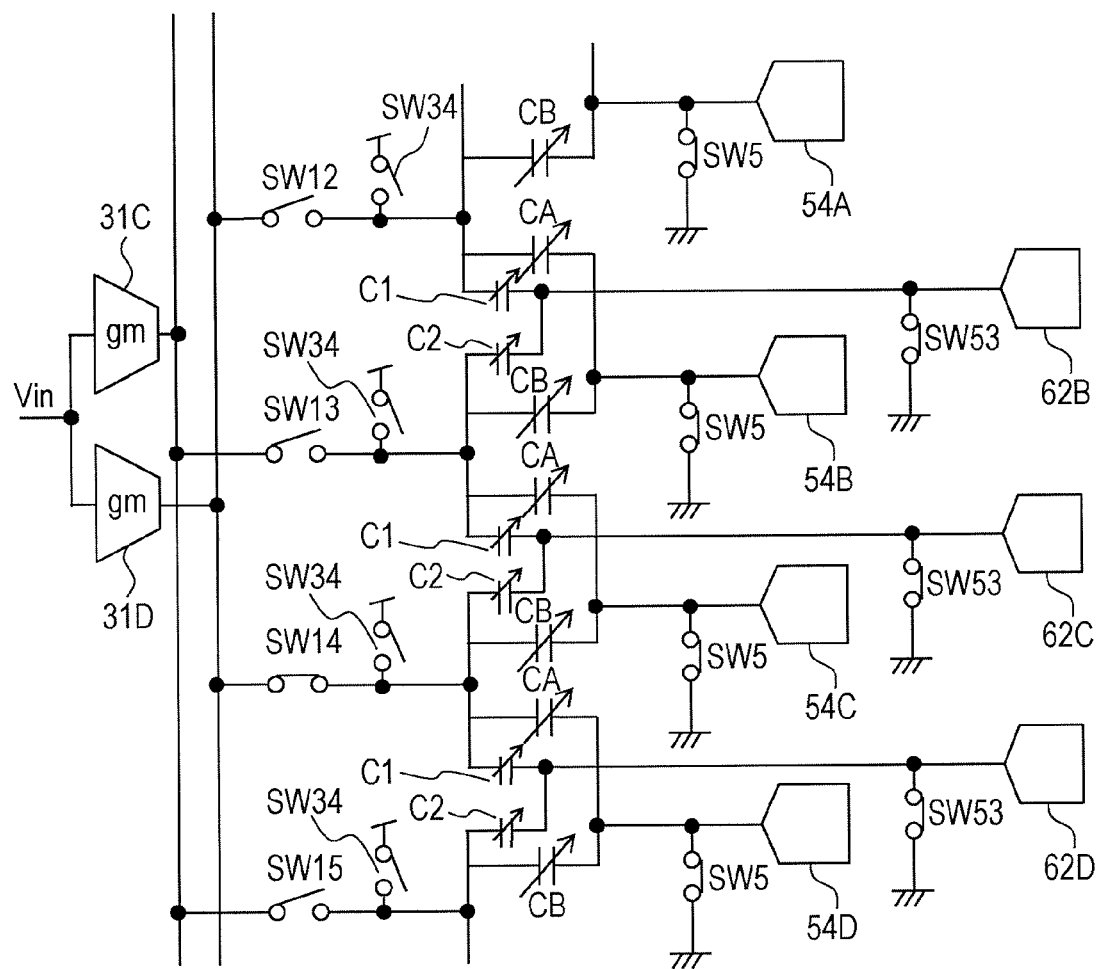
FIG. 21 is a diagram illustrating a configuration of a receiver circuit according to a fourth embodiment.

FIG. 21 is a diagram illustrating an example configuration of a receiver circuit according to the fourth embodiment. In an interpolator according to the fourth embodiment, the switches of the DI 53 and the interpolator for the eye pattern monitor 61 according to the second embodiment are used in common. The receiver circuit according to the fourth embodiment may be the same as or similar to the receiver circuit according to the second embodiment. However, the interpolator of the receiver circuit according to the fourth embodiment may be different from that described with respect to the first embodiment.

As illustrated in FIG. 21, the interpolator according to the fourth embodiment is similar to the interpolator according to the third embodiment illustrated in FIG. 20, but is different in that fixed-capacitance capacitors C1 and C2 are provided instead of the variable-capacitance capacitors C1A and C2A. The various operations of the receiver circuit according to the fourth embodiment are the same as, or similar to, the various operations of the receiver circuit according to the second embodiment.

Fifth Embodiment

Figure 22:
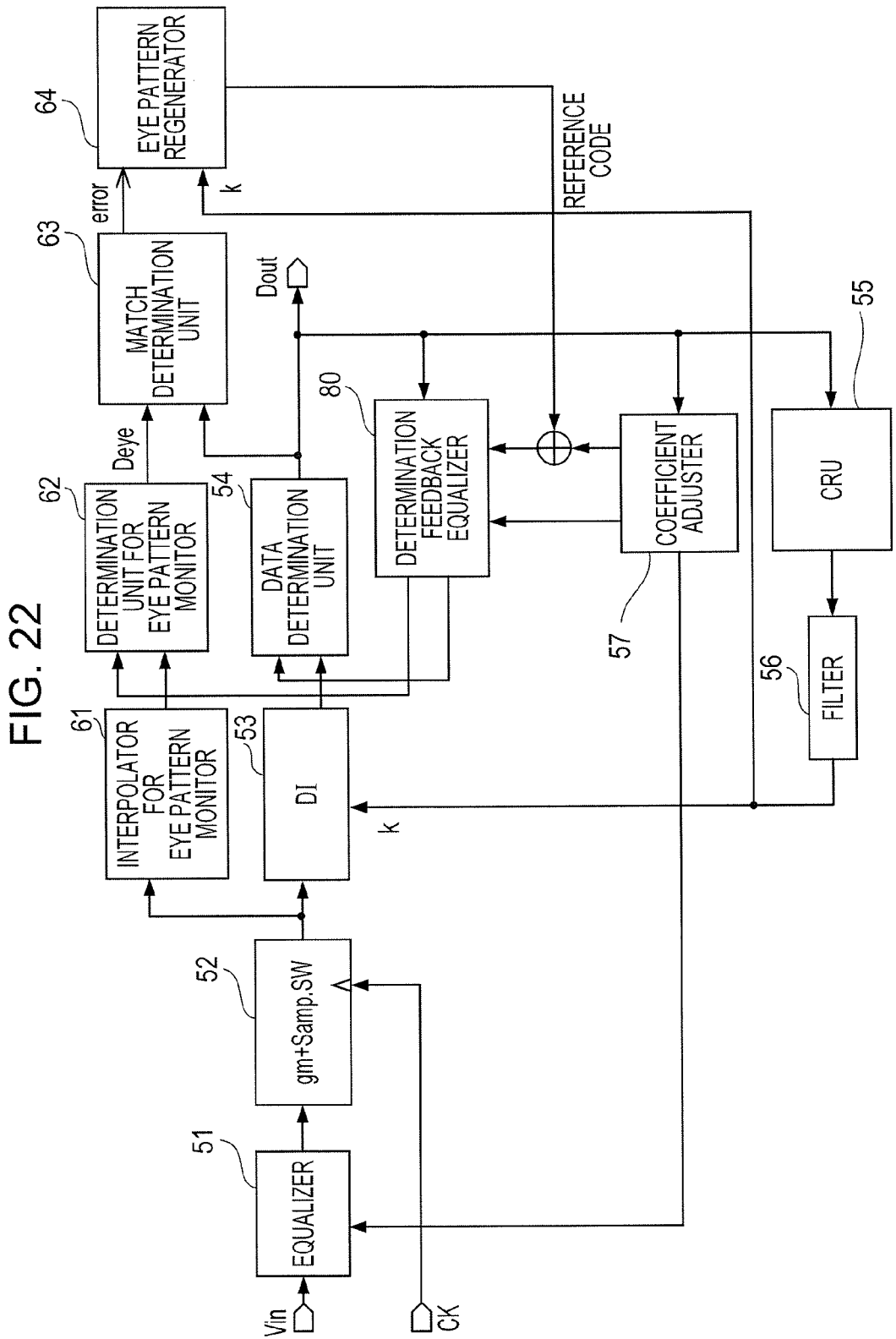
FIG. 22 is a diagram illustrating a configuration of a receiver circuit according to a fifth embodiment.

FIG. 22 is a block diagram illustrating an example configuration of a receiver circuit according to a fifth embodiment. In the receiver circuit according to the fifth embodiment, the reference generator 65 is removed and a determination feedback equalizer 80 is added, as compared to the receiver circuit according to the first embodiment.

The determination feedback equalizer 80 performs a process, which may be similar to the equalizing process of the equalizer 51, on the interpolation data and performs a process that substantially corresponds to the change in the reference voltage on the interpolation data for the eye pattern monitor. Specifically, the determination feedback equalizer 80 increases or decreases a threshold value of the determination in the data determination unit 54 by a certain amount based on the immediately preceding determination result of the data determination unit 54, which may indicate "1" or "0" and which is output data Dout, of the data determination unit 54. Further, the determination feedback equalizer 80 changes the threshold value of the determination in the determination unit for the eye pattern monitor 62 by an amount resulting from adding a reference code to the amount of the change in the threshold value of the determination. The sweep in the voltage direction may be substantially performed by changing the reference code.

In the fifth embodiment, the eye pattern on which the determination unit for the eye pattern monitor 54 performs the determination has a waveform formed through the determination feedback equalizer 80, and, as such, a substantial eye pattern may be obtained upon completion of the equalizing process.

Figure 23:
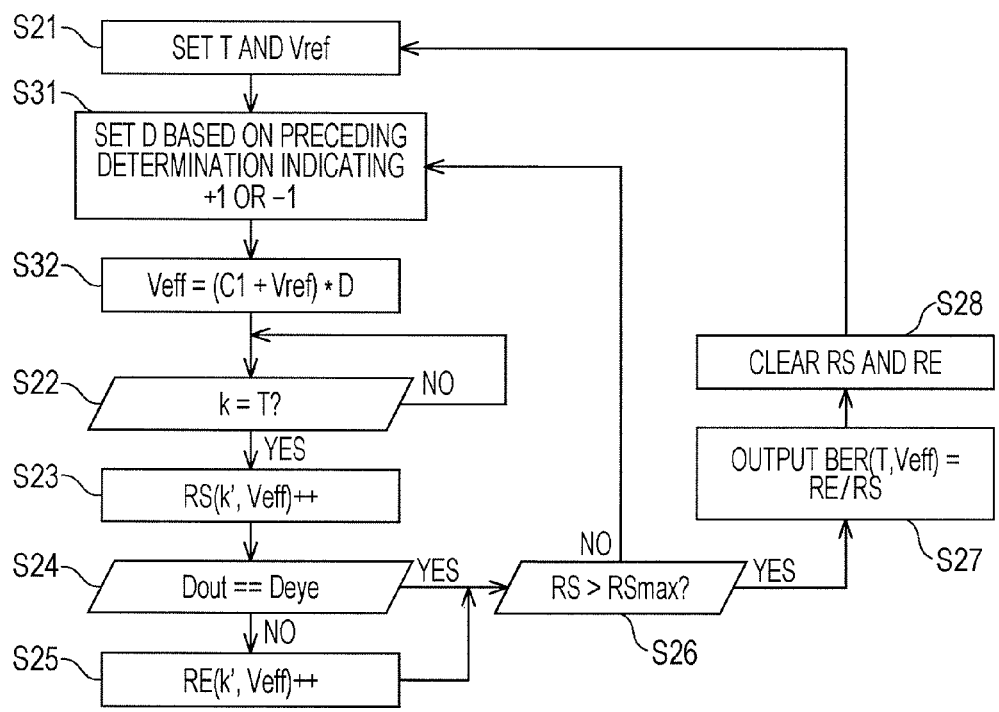
FIG. 23 is a flow chart illustrating a method of eye pattern measurement according to the fifth embodiment.

FIG. 23 is a flow chart illustrating a method of eye pattern measurement according to the fifth embodiment. Compared to the flow chart that illustrates the method of eye pattern measurement according to the second embodiment, the method of eye pattern measurement according to the fifth embodiment is different in that operations S31 and S32 are performed between operations S21 and S22 and that depending on the determination result of operation S26, the process returns to operation S31.

In operation S31, the determination feedback equalizer 80 increases or decreases a threshold value of the determination in the data determination unit 54 by the certain amount based on the immediately preceding determination result of the data determination unit 54, which indicates "1" or "0" and is the output data Dout. Further, the determination feedback equalizer 80 changes the threshold value of the determination in the determination unit for the eye pattern monitor 62 by the amount resulting from adding the reference code to the amount of the change in the threshold value of the determination. Specifically, data D are set to −1 or +1 based on the preceding output data Dout indicating "0" or "1" because, as described with respect to equalizer 51, the signal level differs, depending on the value of the preceding transmission data.

In operation S32, the determination unit for the eye pattern monitor 62 calculates an actual reference voltage Veff, which is actually set, based on the following equation: Veff=(Cd+Vref)*D. Based on the results of the equation, the determination unit for the eye pattern monitor 62 sets the actual reference voltage Veff for the circuit.

The operations after operation S32 are similar to those described with respect to the flow chart according to the second embodiment in FIG. 18. However, as compared with the second embodiment, the flow chart of FIG. 23 returns to operation S31 when the number of samples RS does not reach the certain number of samples Rsmax, as determined in operation S26. In an aspect, the eye pattern measurement process of the fifth embodiment may be performed based on the flow chart according to the first embodiment illustrated in FIG. 15, and in that case, operations S31 and S32 may be performed between operation S11 and operation S12.

In the embodiments described above, and as mentioned herein, variations of the embodiments may be employed, such as the examples described with respect to the circuits used in each part or the interleaving configuration.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A receiver circuit comprising:
   a data interpolator configured to interpolate an input data signal and generate an interpolation data signal;
   a data determination unit configured to determine a data determination result of the interpolation data signal;
   a clock recovery unit configured to detect phase information based on a data determination result of the data determination unit and output an interpolation code to the data interpolator based on the detected phase information, the interpolation code determining an interpolation rate of the data interpolator;
   a first interpolator for an eye pattern monitor configured to interpolate the input data signal and generate an interpolation data signal for the eye pattern monitor;
   a first determination unit for the eye pattern monitor configured to compare the interpolation data signal for the eye pattern monitor with a reference voltage;
   a match determination unit configured to determine whether the data determination result of the data determination unit matches a comparison result of the first determination unit for the eye pattern monitor; and
   an eye pattern regenerator configured to generate an eye pattern based on the phase information and a determination result of the match determination unit.

2. The receiver circuit according to claim 1, wherein the data interpolator includes
   a voltage-current converter configured to convert the input data signal into a current signal, and
   a switched capacitor configured to include a first variable-capacitance capacitor and a second variable-capacitance capacitor, values of capacitances of the first variable-capacitance capacitor and the second variable-capacitance capacitor being adjustable based on the interpolation code, and
   wherein the data interpolator is configured to sample the current signal at different successive timings based on the first variable-capacitance capacitor and the second variable-capacitance capacitor, and is further configured to generate the interpolation data by combining the sampled value of the current signal with the capacitances of the first variable-capacitance capacitor and the second variable-capacitance capacitor.

3. The receiver circuit according to claim 2, wherein the data interpolator includes a plurality of switched capacitors configured to perform an interleaving operation according to a multiphase clock.

4. The receiver circuit according to claim 2, wherein the first interpolator is further configured to generate the interpolation data signal by combining the sampled value with capacitances of a first auxiliary capacitor and a second auxiliary capacitor, the first auxiliary capacitor and the second auxiliary capacitor being configured to perform a switched-capacitor operation, with a switch to be used in common with the switched capacitor of the data interpolator.

5. The receiver circuit according to claim 4, wherein the values of the capacitances of the first auxiliary capacitor and the second auxiliary capacitor are variable.

6. The receiver circuit according to claim 4, wherein the values of the capacitances of the first auxiliary capacitor and the second auxiliary capacitor are fixed.

7. The receiver circuit according to claim 1, wherein the clock recovery unit is further configured to detect the phase information by comparing data near a transition point of the data determination result of the data determination unit with data at an adjacent point.

8. The receiver circuit according to claim 7, further comprising:
   a reference generator configured to generate a reference voltage for the eye pattern monitor based on a reference code generated by the eye pattern regenerator.

9. The receiver circuit according to claim 8, wherein the eye pattern regenerator is further configured to calculate a bit error rate on a time-voltage lattice point based on the reference code, the phase information detected by the clock recovery unit, and the determination result of the match determination unit.

10. The receiver circuit according to claim 9, further comprising:
    a determination feedback equalizer configured to correct a determination level of the data determination unit based on a preceding determination result of the data determination unit, and is further configured to change the reference voltage based on the preceding determination result of the data determination unit and the reference code generated by the eye pattern regenerator.

* * * * *